US006992921B2

(12) United States Patent
Fukuzumi

(10) Patent No.: US 6,992,921 B2
(45) Date of Patent: Jan. 31, 2006

(54) MAGNETIC RANDOM ACCESS MEMORY AND DATA WRITE METHOD FOR THE SAME

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 10/895,138

(22) Filed: Jul. 21, 2004

(65) Prior Publication Data

US 2005/0205909 A1 Sep. 22, 2005

(30) Foreign Application Priority Data

Mar. 16, 2004 (JP) ............................. 2004-074460

(51) Int. Cl.
*G11C 11/00* (2006.01)
(52) U.S. Cl. ...................... 365/158; 365/171; 365/173
(58) Field of Classification Search ................ 365/158, 365/171, 173
See application file for complete search history.

(56) References Cited

U.S. PATENT DOCUMENTS

| 6,269,018 | B1 * | 7/2001 | Monsma et al. ............. 365/145 |
| 6,404,674 | B1 * | 6/2002 | Anthony et al. ............ 365/173 |
| 6,590,803 | B2 | 7/2003 | Saito et al. |
| 6,785,160 | B1 * | 8/2004 | Sharma et al. ............. 365/158 |
| 2005/0072997 | A1 * | 4/2005 | Kikuchi et al. ............ 257/295 |

FOREIGN PATENT DOCUMENTS

| JP | 2002-299574 | 10/2002 |
| JP | 2003-163330 | 6/2003 |

OTHER PUBLICATIONS

U.S. Appl. No. 10/379,915, filed Mar. 6, 2003, Yoda et al.
U.S. Appl. No. 11/066,309, filed Feb. 28, 2005, Inaba.

* cited by examiner

Primary Examiner—Huan Hoang
(74) Attorney, Agent, or Firm—Oblon, Spivak, McClelland, Maier & Neustadt, P.C.

(57) ABSTRACT

A magnetic random access memory includes a first write wiring line which runs in a first direction, a second write wiring line which has first and second regions run in the first and second directions, a magnetoresistive element formed between the first write wiring line and the first region, first and second yoke layers, the magnetoresistive element having a recording layer which has an easy axis of magnetization whose direction in a non-energized state tilts by 30° to 60° with respect to the first direction, first and second ferromagnetic layers which are formed from a ferromagnetic material whose direction of magnetization in the non-energized state is aligned to the first direction, and magnetically coupled to the recording layer, and first and second non-magnetic layers formed between the recording layer and the first and second ferromagnetic layers, respectively.

20 Claims, 15 Drawing Sheets

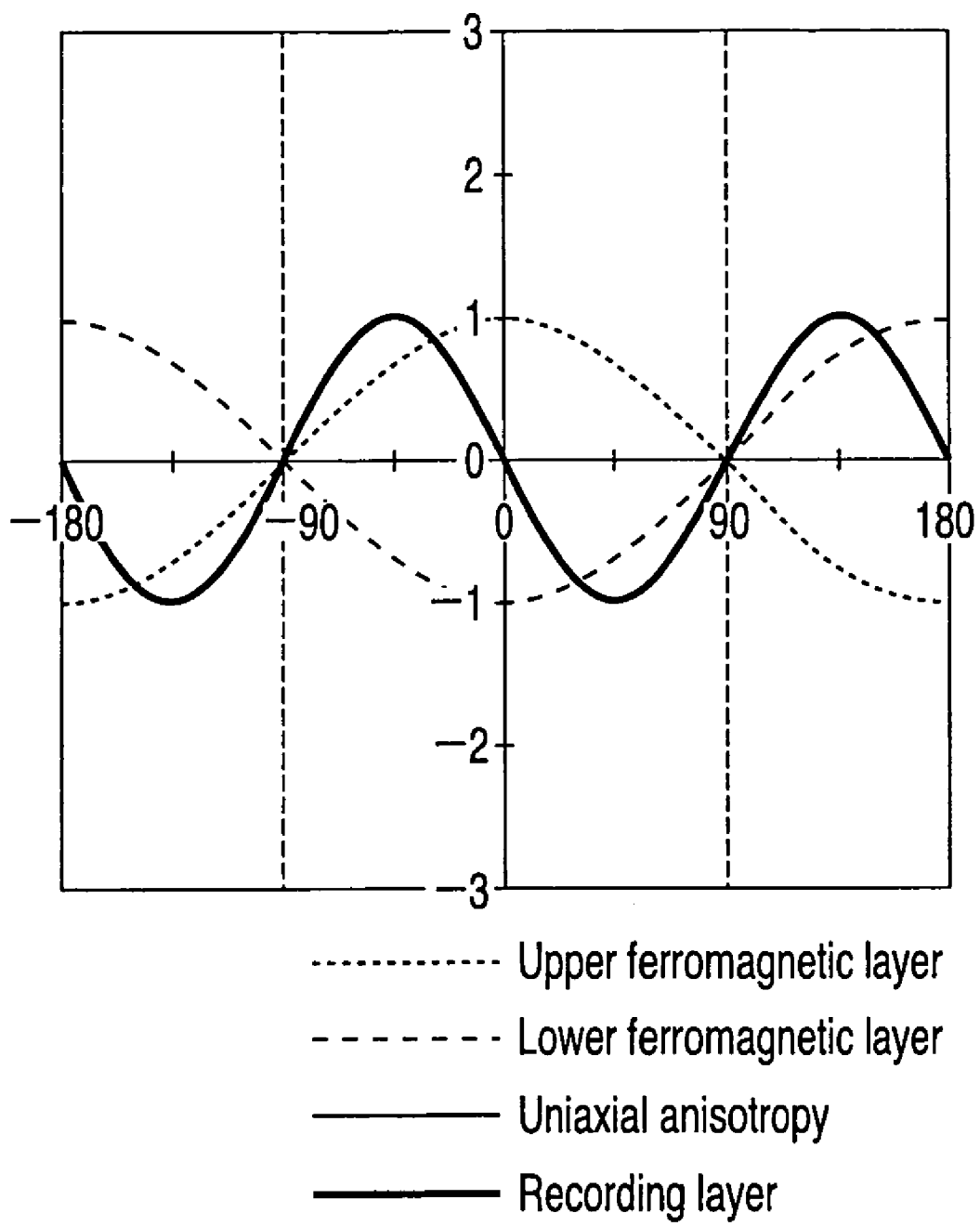
F I G. 9

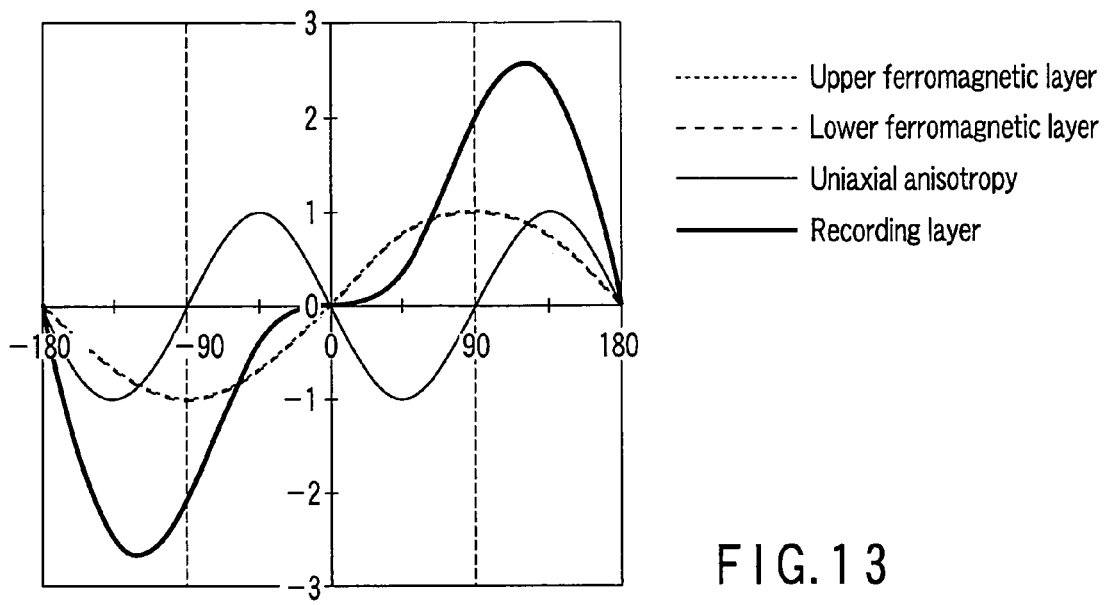
F I G. 1 3
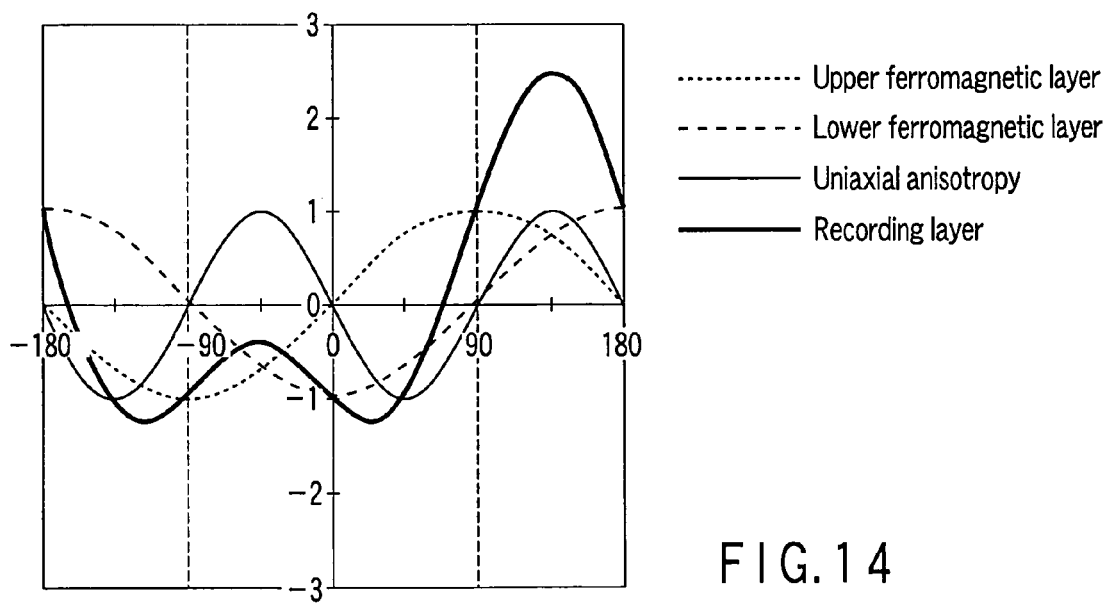
F I G. 1 4

MAGNETIC RANDOM ACCESS MEMORY AND DATA WRITE METHOD FOR THE SAME

CROSS-REFERENCE TO RELATED APPLICATIONS

This application is based upon and claims the benefit of priority from prior Japanese Patent Application No. 2004-074460, filed Mar. 16, 2004, the entire contents of which are incorporated herein by reference.

BACKGROUND OF THE INVENTION

1. Field of the Invention

The present invention relates to an MRAM (Magnetic Random Access Memory) having a magnetoresistive element and a data write method for the magnetic random access memory.

2. Description of the Related Art

In recent years, an MRAM (Magnetic Random Access Memory) using a TMR (Tunnel Magneto-Resistance) effect has been proposed as a kind of semiconductor memory.

In the memory cells of an MRAM, an MTJ (Magnetic Tunneling Junction) element serving as an information storage element is formed at the interconnection between a bit line and a word line. In a data write mode, a current is supplied to each of a selected bit line and a selected word line. Data is written in the MTJ element of the selected cell located at the intersection between the selected bit line and the selected word line by a composite magnetic filed generated by the currents. In a data read mode, a read current is supplied to the MTJ element of a selected cell so that "1" or "0" data is read out in accordance with a resistance change in the magnetized state of the MTJ element.

In the data write mode of such an MRAM, a write current magnetic field may affect even semi-selected cells selected by one of the selected bit line and selected word line to cause a write error in the semi-selected cells, i.e., rise a problem of disturbance. Avoiding this disturbance problem is being considered as one of most important challenges in MRAM development. However, the shape of an MTJ element and the like sensitively affect the asteroid characteristic. For this reason, the influence on the asteroid characteristic further becomes large as the element size decreases. This may increase write errors in semi-selected cells and make the disturbance problem more serious along with the size reduction of elements. To avoid this problem, the write current must be made large not to cause any write error in semi-selected cells. There is a toggle type MRAM using a recording layer having a multilayered structure with weak coupling. Even in this type, the write current value becomes large.

Prior-art references associated with the present invention are as follows.

[Patent reference 1] Jpn. Pat. Appln. KOKAI Publication No. 2002-299574

[Patent reference 2] Jpn. Pat. Appln. KOKAI Publication No. 2003-163330

BRIEF SUMMARY OF THE INVENTION

According to a first aspect of the present invention, there is provided a magnetic random access memory comprising a first write wiring line which runs in a first direction, a second write wiring line which has a first region where the second write wiring line runs in the first direction while overlapping the first write wiring line and a second region where the second write wiring line runs in a second direction different from the first direction, a magnetoresistive element formed between the first write wiring line and the first region of the second write wiring line, a first yoke layer which is formed from a magnetic layer and formed on a surface of the first write wiring line on an opposite side of a surface facing the magnetoresistive element and both side surfaces of the first write wiring line, and a second yoke layer which is formed from a magnetic layer and formed on a surface of the second write wiring line on an opposite side of a surface facing the magnetoresistive element and both side surfaces of the second write wiring line, the magnetoresistive element having a recording layer which is formed from a ferromagnetic material, comprises a first surface and a second surface, and has an easy axis of magnetization whose direction in a non-energized state tilts by 30° to 60° with respect to the first direction, a first ferromagnetic layer which is formed on a side of the first surface of the recording layer, formed from a ferromagnetic material whose direction of magnetization in the non-energized state is aligned to the first direction, and magnetically coupled to the recording layer by first magnetic coupling, a second ferromagnetic layer which is formed on a side of the second surface of the recording layer, formed from a ferromagnetic material whose direction of magnetization in the non-energized state is aligned to the first direction, and magnetically coupled to the recording layer by second magnetic coupling, a first nonmagnetic layer formed between the recording layer and the first ferromagnetic layer, and a second nonmagnetic layer formed between the recording layer and the second ferromagnetic layer.

According to a second aspect of the present invention, there is provided a data write method for a magnetic random access memory comprising a first write wiring line which runs in a first direction, a second write wiring line which has a first region where the second write wiring line runs in the first direction while overlapping the first write wiring line and a second region where the second write wiring line runs in a second direction different from the first direction, a magnetoresistive element formed between the first write wiring line and the first region of the second write wiring line, a first yoke layer which is formed from a magnetic layer and formed on a surface of the first write wiring line on an opposite side of a surface facing the magnetoresistive element and both side surfaces of the first write wiring line, and a second yoke layer which is formed from a magnetic layer and formed on a surface of the second write wiring line on an opposite side of a surface facing the magnetoresistive element and both side surfaces of the second write wiring line, the magnetoresistive element having a recording layer which is formed from a ferromagnetic material, comprises a first surface and a second surface, and has an easy axis of magnetization whose direction in a non-energized state tilts by 30° to 60° with respect to the first direction, a first ferromagnetic layer which is formed on a side of the first surface of the recording layer, formed from a ferromagnetic material whose direction of magnetization in the non-energized state is aligned to the first direction, and magnetically coupled to the recording layer by first magnetic coupling, a second ferromagnetic layer which is formed on a side of the second surface of the recording layer, formed from a ferromagnetic material whose direction of magnetization in the non-energized state is aligned to the first direction, and magnetically coupled to the recording layer by second magnetic coupling, a first nonmagnetic layer formed between the recording layer and the first ferromagnetic layer, and a second nonmagnetic layer formed between the recording layer and the second ferromagnetic layer, comprising in writing data in the magnetoresistive element, supplying a first write current and a second write current to the first write wiring line and the second write wiring line, respectively, to generate a first magnetic field and a second magnetic field by the first write current and the second write current, respectively, applying the first magnetic field and the second magnetic field to the first ferromagnetic layer and the second ferromagnetic layer, respectively, to rotate the magnetization of the first ferromagnetic layer and the second ferromagnetic layer, respectively, causing the magnetization of the first ferromagnetic layer and the second ferromagnetic layer to rotate to rotate magnetization of the recording layer by the first magnetic coupling and the second magnetic coupling.

BRIEF DESCRIPTION OF THE SEVERAL VIEWS OF THE DRAWING

FIG. 9 is a graph showing the fourth cycle of the "0" data write of the magnetic random access memory according to the first embodiment of the present invention;

FIG. 13 is a graph showing the second cycle of the "1" data write of the magnetic random access memory according to the first embodiment of the present invention;

FIG. 14 is a graph showing the third cycle of the "1" data write of the magnetic random access memory according to the first embodiment of the present invention;

DETAILED DESCRIPTION OF THE INVENTION

Figure 1:
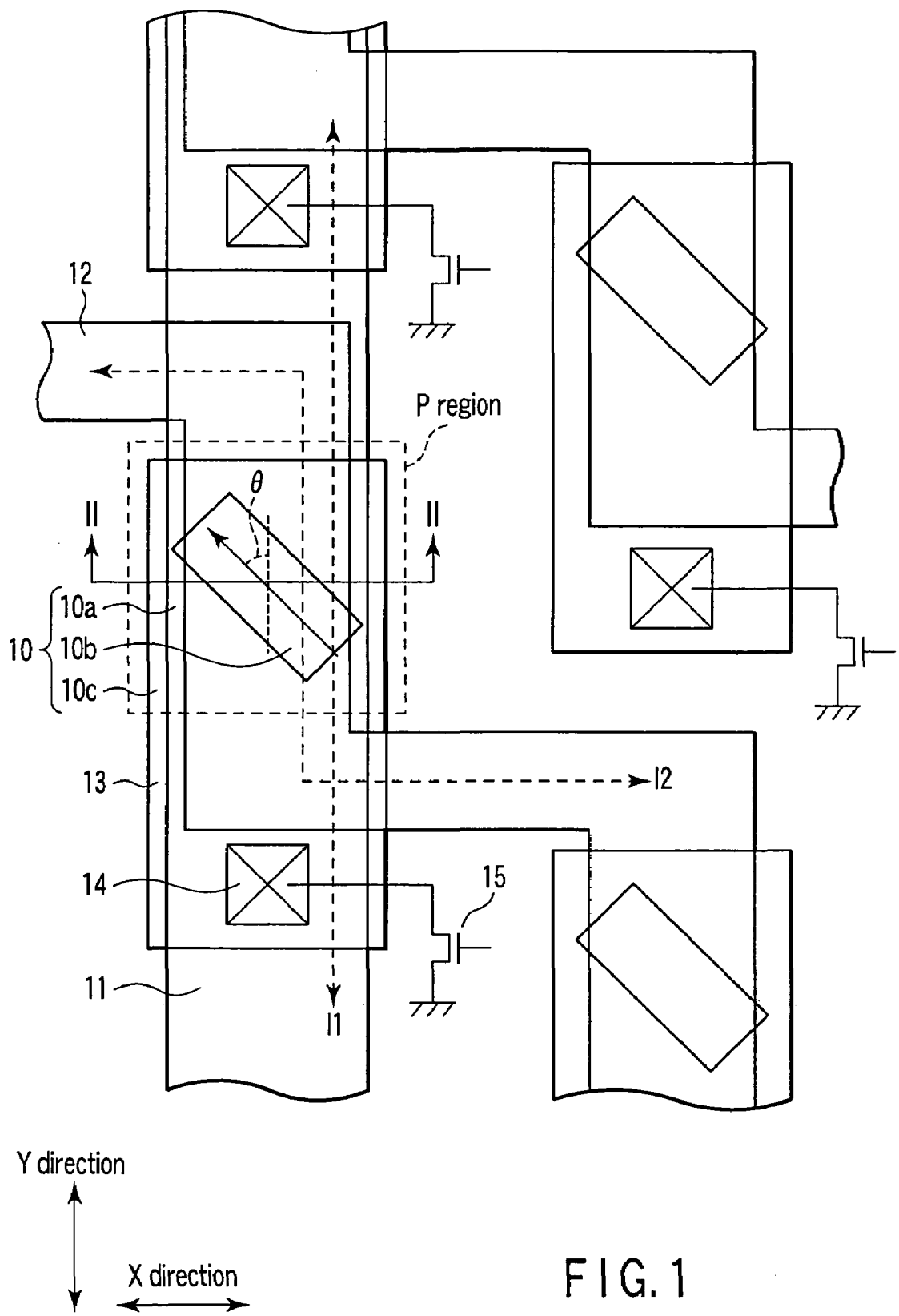
FIG. 1 is a schematic plan view showing a magnetic random access memory according to the first embodiment of the present invention.

Embodiments of the present invention will be described below with reference to the accompanying drawing. The same reference numerals denote the same parts throughout the drawing.

[First Embodiment]

In the first embodiment, nonmagnetic layers are formed on the upper and lower sides of the recording layer of an MTJ (Magnetic Tunnel Junction) element, and ferromagnetic layers are formed on the two nonmagnetic layers, respectively. The recording layer and ferromagnetic layers are coupled in a weak magnetic coupling state, and a two-axis write is performed by this magnetic coupling.

(1) Structure

Figure 2:
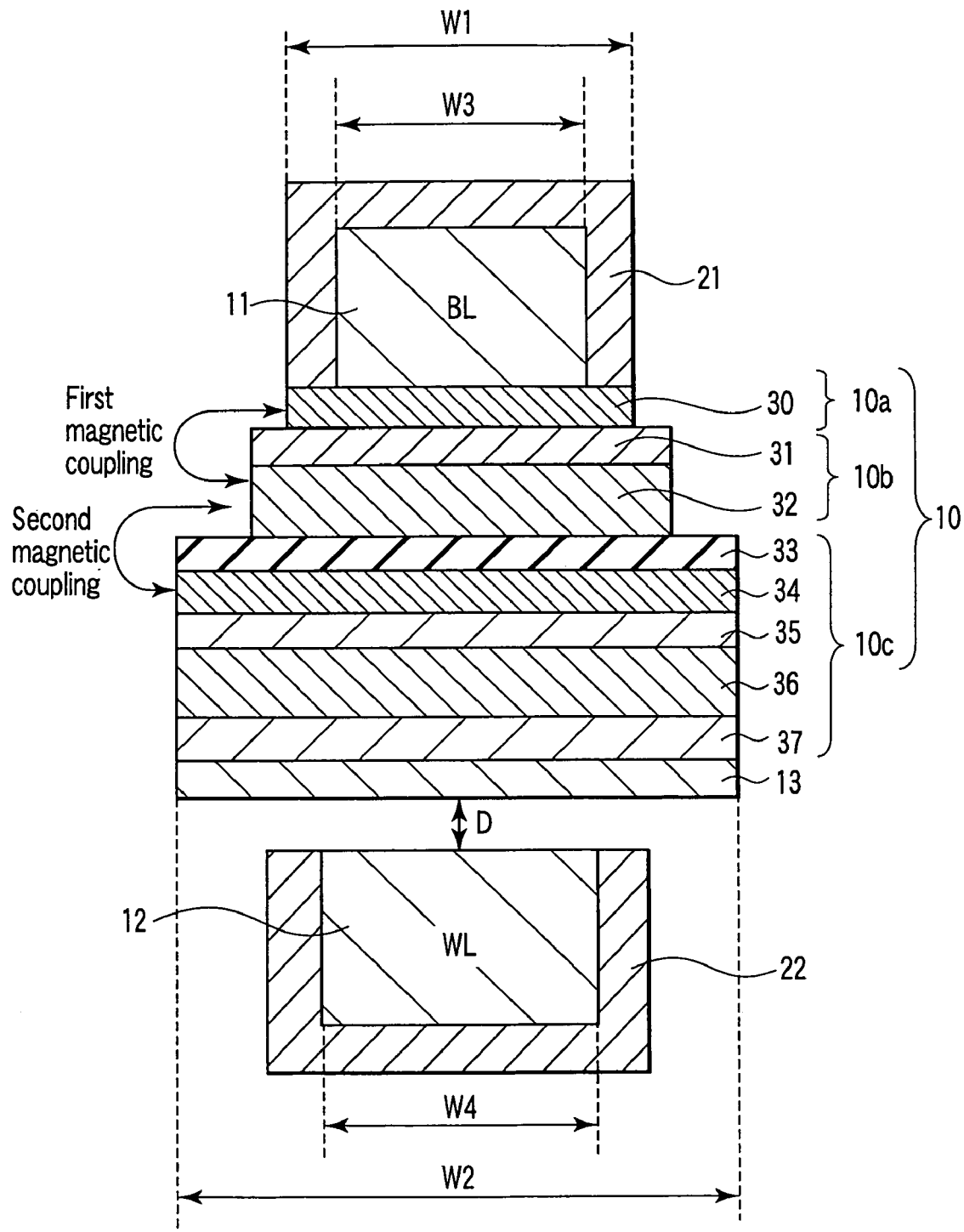
FIG. 2 is a sectional view of the magnetic random access memory taken along a line II—II in FIG. 1.
Figure 3:
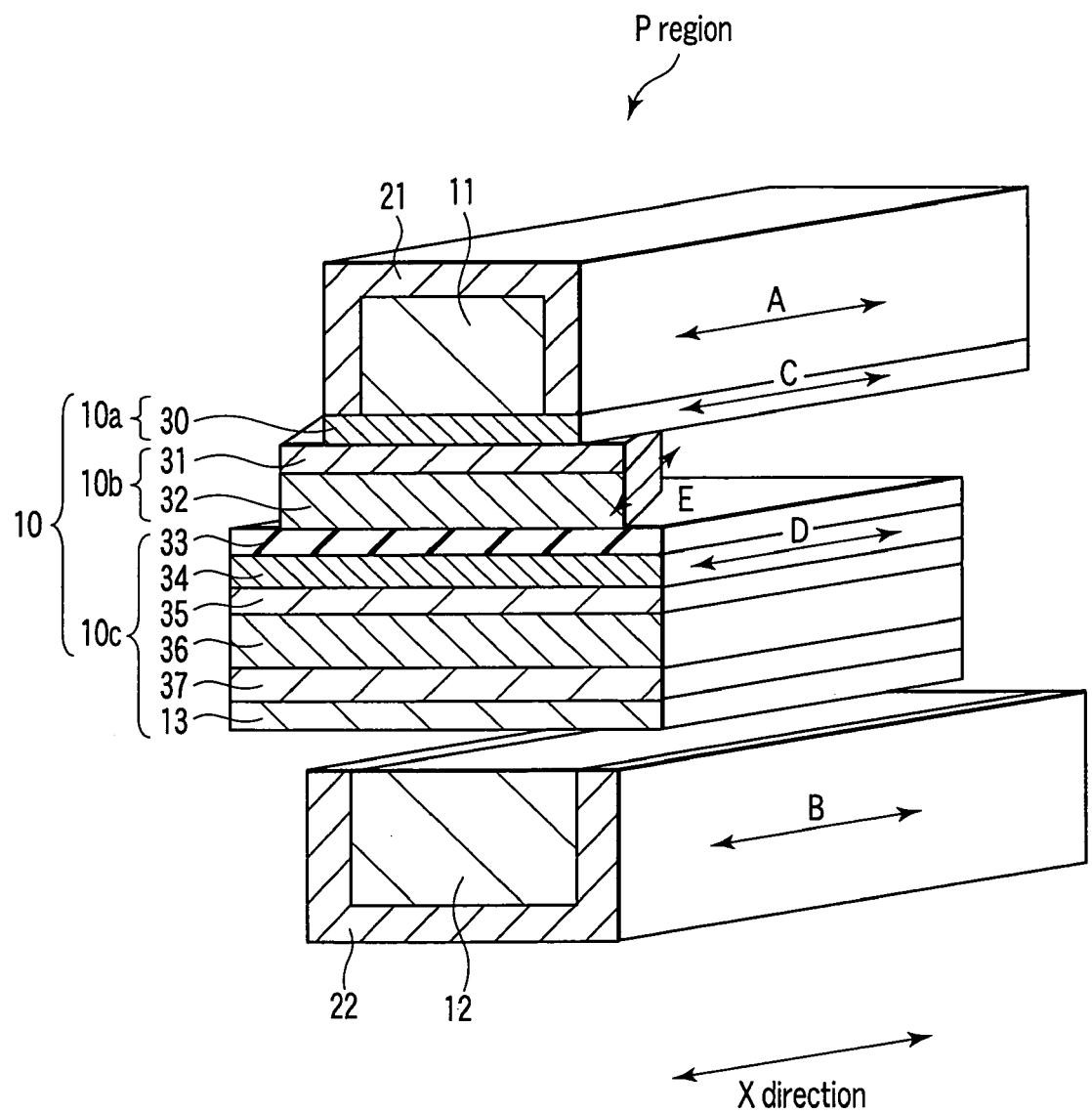
FIG. 3 is a schematic perspective view showing the magnetic random access memory according to the first embodiment of the present invention.

FIG. 1 is a schematic plan view of a magnetic random access memory according to the first embodiment of the present invention. FIG. 2 is a sectional view of the magnetic random access memory taken along a line II—II in FIG. 1. FIG. 3 is a schematic perspective view of the magnetic random access memory according to the first embodiment of the present invention. The structure of the magnetic random access memory according to the first embodiment will be described below.

As shown in FIGS. 1 and 2, in a memory cell, a bit line (BL) 11 which functions as a write/read wiring line runs in the Y direction, and a word line (WL) 12 which functions as a write wiring line runs in the X and Y directions. Hence, there is a P region where both the bit line 11 and word line 12 overlap and run parallel to each other in the Y direction, i.e., write currents I1 and I2 for the bit line 11 and word line 12 flow parallel. At least part of an MTJ element 10 as a magnetoresistive element is formed between the bit line 11 and the word line 12 in the P region. One terminal of the MTJ element 10 is electrically connected to the bit line 11. The other terminal of the MTJ element 10 is electrically connected to a lower electrode layer 13. The lower electrode layer 13 is electrically connected to a MOSFET 15 serving as a read switching element through a contact 14. The gate electrode of the MOSFET 15 functions as a read word line. Drivers/sinkers (not shown) are connected to the two ends of each of the bit lines 11 and word lines 12 located around the memory cell array so as to supply the write currents I1 and I2 in both directions of the bit lines 11 and word lines 12.

The MTJ element 10 includes an upper ferromagnetic layer 30, nonmagnetic layer 31, recording layer (free layer) 32, tunnel barrier layer 33, lower ferromagnetic layer 34, nonmagnetic layer 35, fixed layer (pinning layer) 36, and anti-ferromagnetic layer 37. The MTJ element 10 includes a first portion 10a, second portion 10b, and third portion 10c. The first portion 10a includes the upper ferromagnetic layer 30. The second portion 10b includes the nonmagnetic layer 31 and recording layer 32. The third portion 10c includes the tunnel barrier layer 33, lower ferromagnetic layer 34, nonmagnetic layer 35, fixed layer 36, and anti-ferromagnetic layer 37.

The recording layer 32 has an easy axis of magnetization along the longitudinal direction of the second portion 10b of the MTJ element 10 viewed from the upper side. The easy axis of magnetization has uniaxial anisotropy.

The second portion 10b located in the P region tilts by θ with respect to the direction (Y direction) in which the write currents I1 and I2 flow through the bit line 11 and word line 12. In other words, the easy axis of magnetization of the recording layer 32 tilts by θ with respect to the Y direction. The tilt θ is about 30° to 60°, and most preferably, 45° (−45°).

The first portion 10a runs in the Y direction, like the bit line 11. The second portion 10b has an rectangular island shape. The third portion 10c is larger than the second portion 10b and has the same planar shape as that of the lower electrode layer 13. That is, the first portion 10a, second portion 10b, and third portion 10c have different planar shapes.

The upper ferromagnetic layer 30 and recording layer 32 are magnetically coupled (to be referred to as first magnetic coupling hereinafter). The lower ferromagnetic layer 34 and recording layer 32 are magnetically coupled (to be referred to as second magnetic coupling hereinafter). Hence, magnetization of the recording layer 32 is not only directly influenced by magnetic fields generated from the write currents I1 and I2 flowing to the bit line 11 and word line 12 but also rather influenced by magnetization of the upper ferromagnetic layer 30 or lower ferromagnetic layer 34.

The nonmagnetic layer 31 is formed between the recording layer 32 and the upper ferromagnetic layer 30. The nonmagnetic layer (tunnel barrier layer 33) is formed between the recording layer 32 and the lower ferromagnetic layer 34. Unlike a structure having no nonmagnetic layers, the first magnetic coupling and second magnetic coupling can be set in a weak magnetic coupling state.

The first magnetic coupling and second magnetic coupling may be either ferromagnetic coupling including Néel coupling or anti-ferromagnetic coupling. For example, one of the first magnetic coupling and second magnetic coupling may be ferromagnetic coupling, and the other may be anti-ferromagnetic coupling. Alternatively, both of the first magnetic coupling and second magnetic coupling may be ferromagnetic coupling or anti-ferromagnetic coupling. In ferromagnetic coupling, a stable state is obtained when the magnetization directions are parallel. In anti-ferromagnetic coupling, a stable state is obtained when the magnetization directions are anti-parallel. When the first magnetic coupling and second magnetic coupling are set in the same coupling state, it may sometimes be difficult to make the upper ferromagnetic layer 30 and lower ferromagnetic layer 34 have opposite magnetization directions in the initial state. To prevent this, for example, the first magnetic coupling is set to anti-ferromagnetic coupling, and the second magnetic coupling is set to ferromagnetic coupling by Néel coupling.

The uniaxial anisotropic energy of the recording layer 32 and the energies of the first and second magnetic coupling preferably have similar magnitudes. The magnitudes of the energies can be adjusted by changing the materials or thicknesses of the recording layer 32 and nonmagnetic layers 31 and 33.

The bit line 11 and word line 12 are at least partially surrounded by first and second yoke layers 21 and 22 made of magnetic layers, respectively. For example, the first yoke layer 21 is formed on the upper surface (a surface of the bit line 11 on the opposite side of the surface facing the MTJ element 10) of the bit line 11 and both side surfaces of the bit line 11. The second yoke layer 22 is formed on the lower surface (a surface of word line 12 on the opposite side of the surface facing the MTJ element 10) of the word line 12 and both side surfaces of the word line 12. Each of the first and second yoke layers 21 and 22 has an easy axis of magnetization along the longitudinal direction (Y direction). The easy axis of magnetization has uniaxial anisotropy.

When magnetically coupling the first yoke layer 21 and upper ferromagnetic layer 30 and magnetically coupling the second yoke layer 22 and lower ferromagnetic layer 34 are taken into consideration, a relation (1) is preferably satisfied. That is, widths W1 and W2 of the upper ferromagnetic layer 30 and lower ferromagnetic layer 34 are preferably equal to or larger than widths W3 and W4 of the bit line 11 and word line 12.

$$W1, W2 \geq W3, W4 \tag{1}$$

The first yoke layer 21 and bit line 11 come into contact with the upper ferromagnetic layer 30. The second yoke layer 22 and word line 12 do not come into contact with the lower ferromagnetic layer 34. However, a distance D between the lower electrode layer 13 and the second yoke layer 22 and word line 12 is short.

Referring to FIG. 3, the direction (the direction in which the bit line 11 runs) in which the write current I1 of the bit line 11 flows is indicated by an arrow A. The direction (the direction in which the word line 12 runs in the P region) in which the write current I2 of the word line 12 flows is indicated by an arrow B. The direction of magnetization in the upper ferromagnetic layer 30 in a non-energized state is indicated by an arrow C. The direction of magnetization in the lower ferromagnetic layer 34 in a non-energized state is indicated by an arrow D. The direction of the easy axis of magnetization in the recording layer 32 in a non-energized state is indicated by an arrow E. In this case, the arrows A, B, C, and D are preferably almost parallel. The arrow E preferably tilts by θ (e.g., 45°) with respect to the arrows A, B, C, and D.

(2) Material

The layers of the MTJ element 10 and the first and second yoke layers 21 and 22 are preferably formed by using the following materials.

The recording layer 32 and fixed layer 36 are made of, e.g., Fe, Co, Ni, an alloy thereof, magnetite having a high spin polarizability, an oxide such as $CrO_2$ or $RXMnO_{3-y}$ (R: rare earth, X: Ca, Ba, or Sr), or a Heusler alloy such as NiMnSb or PtMnSb. These magnetic materials may have a some content of a nonmagnetic element such as Ag, Cu, Au, Al, Mg, Si, Bi, Ta, B, C, O, N, Pd, Pt, Zr, Ir, W, Mo, or Nb if the ferromagnetic characteristic is not lost.

The tunnel barrier layer 33 is made of, e.g., a dielectric material such as $Al_2O_3$, $SiO_2$, MgO, AlN, $Bi_2O_3$, $MgF_2$, $CaF_2$, $SrTiO_2$, or $AlLaO_3$.

The upper ferromagnetic layer 30 and lower ferromagnetic layer 34 are made of, e.g., Fe, Co, Ni, an alloy thereof, magnetite having a high spin polarizability, an oxide such as $CrO_2$ or $RXMnO_{3-y}$ (R: rare earth, X: Ca, Ba, or Sr), or a Heusler alloy such as NiMnSb or PtMnSb.

The nonmagnetic layers 31 and 35 are made of, e.g., a dielectric material such as Ru, $Al_2O_3$, $SiO_2$, MgO, AlN, $Bi_2O_3$, $MgF_2$, $CaF_2$, $SrTiO_2$, or $AlLaO_3$.

The anti-ferromagnetic layer 37 is made of, e.g., Fe—Mn, Pt—Mn, Pt—Cr—Mn, Ni—Mn, Ir—Mn, NiO, or $Fe_2O_3$.

The first and second yoke layers 21 and 22 are made of, e.g., NiFe, CoFe, amorphous-CoZrNb, FeNx, or FeAlSi.

(3) Write/Read Operation

The write/read operation in the magnetic random access memory according to the first embodiment will be described. Assume that the upper ferromagnetic layer 30 and recording layer 32 are coupled by anti-ferromagnetic coupling, and the lower ferromagnetic layer 34 and recording layer 32 are coupled by ferromagnetic coupling.

(a) Write Operation

Figure 15:
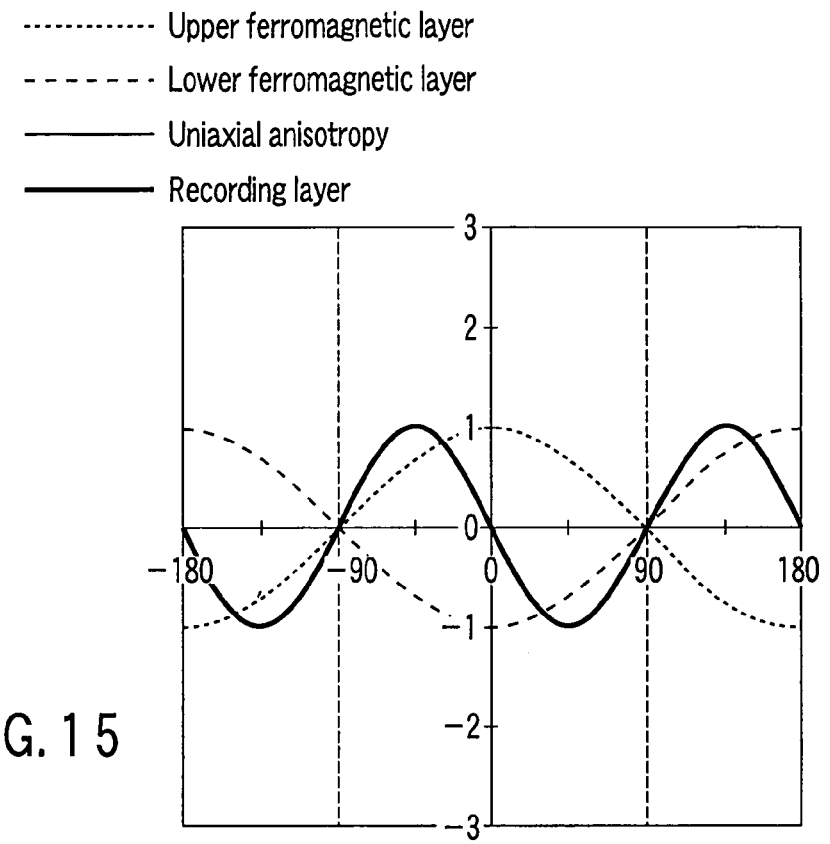
FIG. 15 is a graph showing the fourth cycle of the "1" data write of the magnetic random access memory according to the first embodiment of the present invention.
Figure 16:
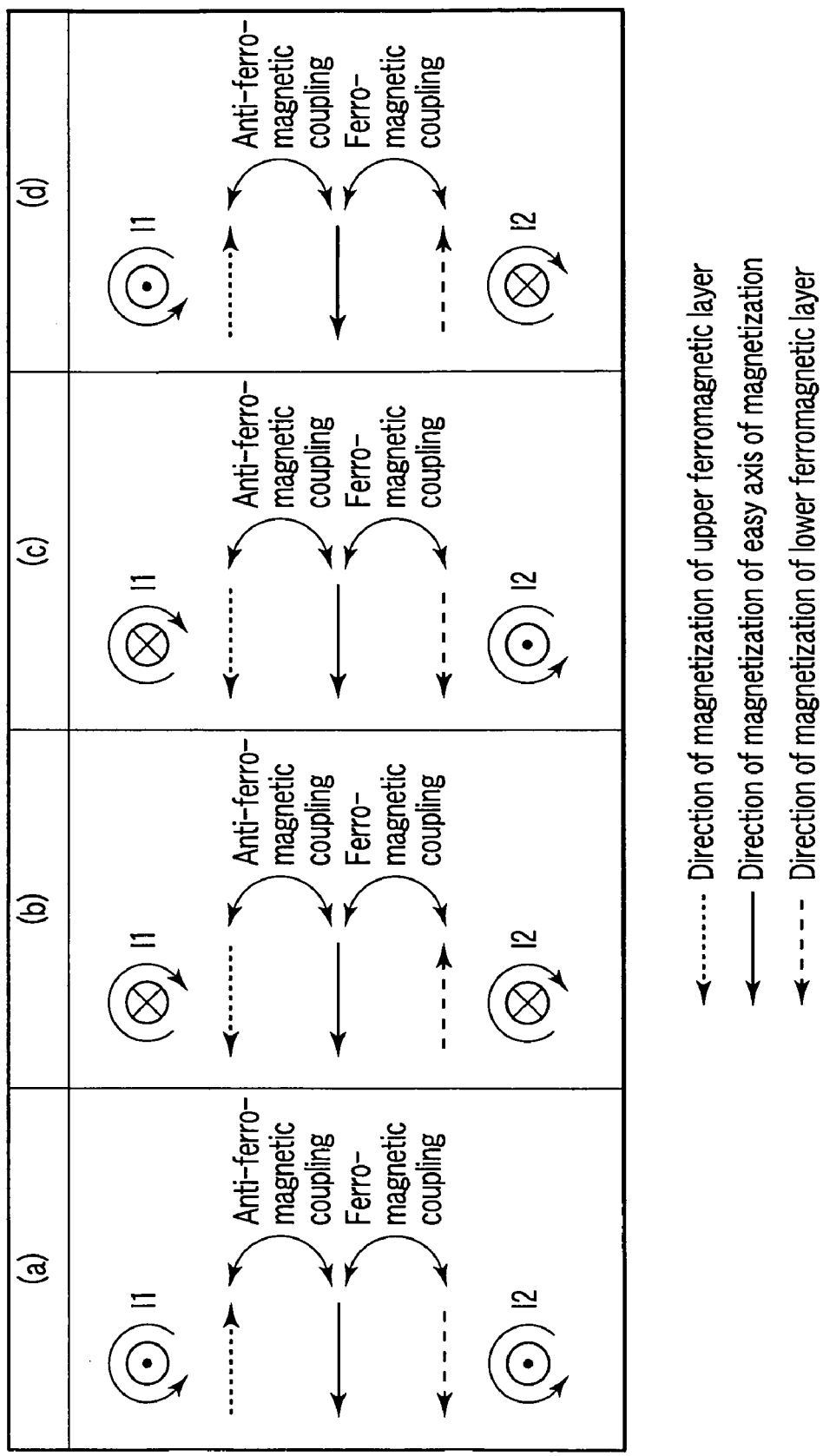
FIG. 16 is a view showing the relationship between the magnetic coupling state and the write current direction of the magnetic random access memory according to the first embodiment of the present invention.

FIGS. 4 to 9 are explanatory views of the "0" data write operation in the magnetic random access memory according to the first embodiment of the present invention. FIGS. 10 to 15 are explanatory views of the "1" data write operation in the magnetic random access memory according to the first embodiment of the present invention. FIG. 16 shows the relationship between the magnetic coupling state and the write current direction of the magnetic random access memory according to the first embodiment of the present invention.

For the write operation, two write wiring lines are sequentially turned on. The write wiring line which is turned on first is turned off first. Then, the write wiring line which is turned on later is turned off. For example, the procedures include four cycles: the word line 12 is turned on to supply the write current I2→the bit line 11 is turned on to supply the write current I1→the word line 12 is turned off to stop supplying the write current I2→the bit line 11 is turned off to stop supplying the write current I1. The procedures will be described below in detail.

Figure 4:
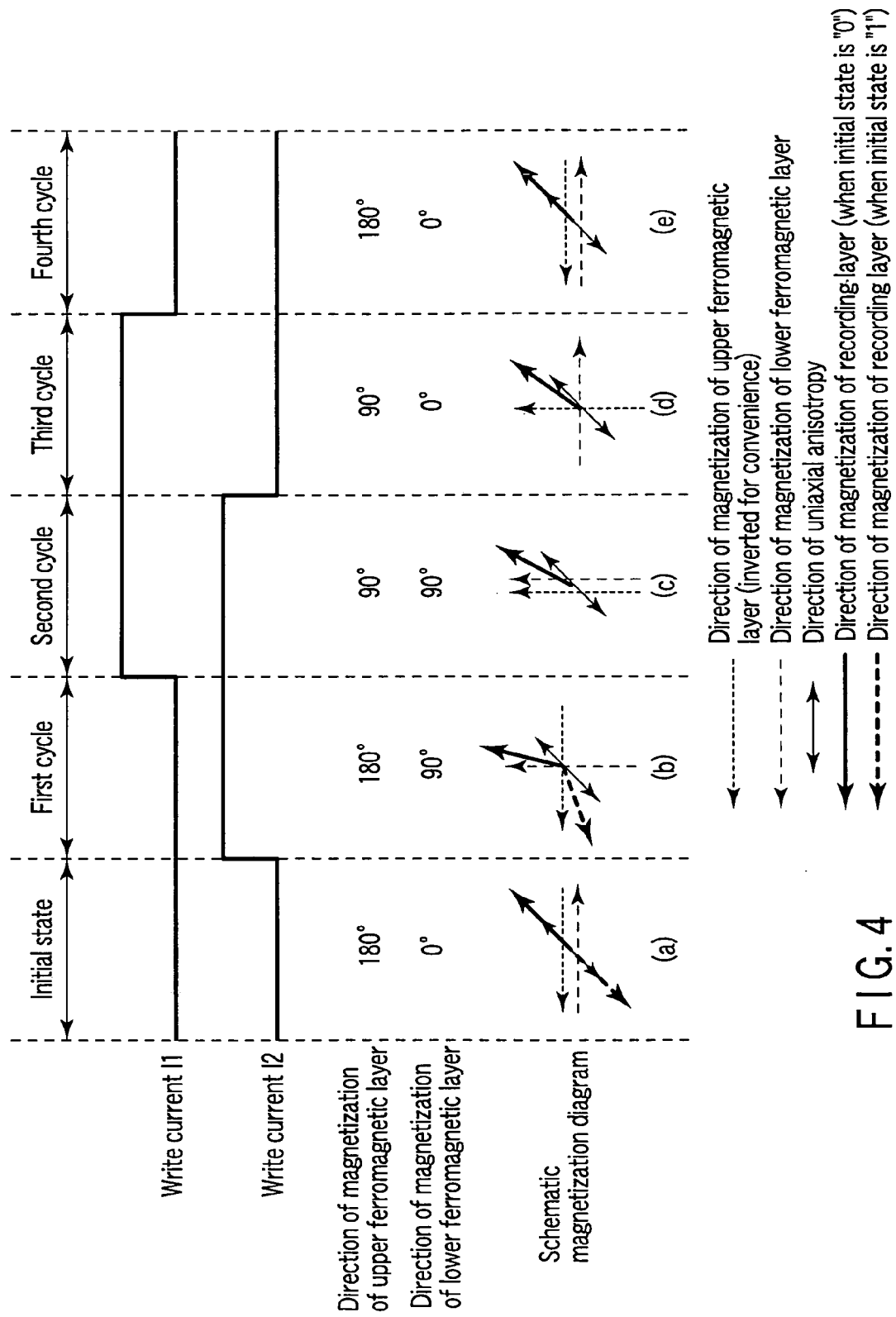
FIG. 4 is a view showing the "0" data write of the magnetic random access memory according to the first embodiment of the present invention.
Figure 10:
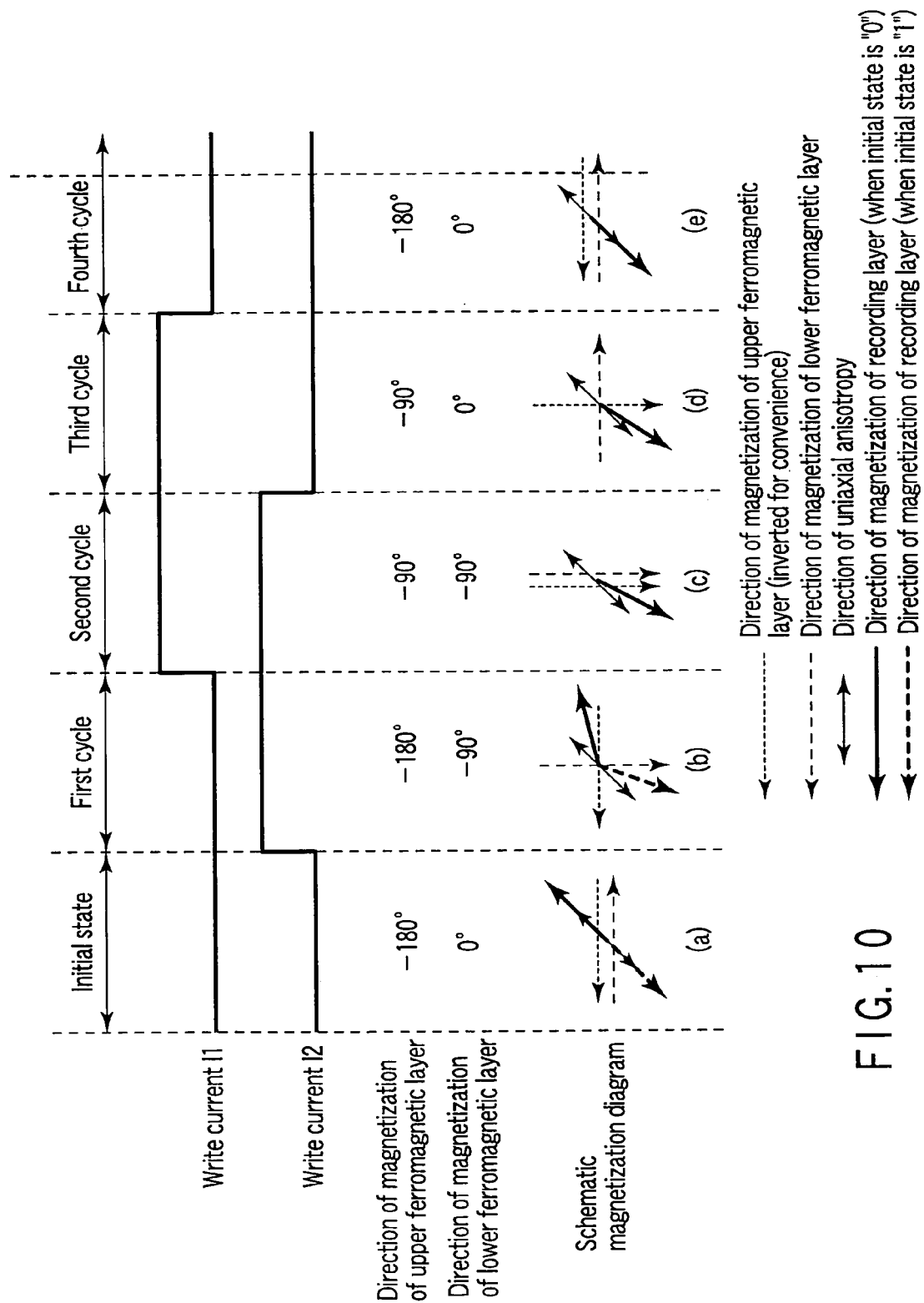
FIG. 10 is a view showing the "1" data write of the magnetic random access memory according to the first embodiment of the present invention.

The schematic magnetization diagrams in FIGS. 4 and 10 show both magnetization when the data in the recording layer 32 in the initial state is "0" and magnetization when the data is "1" are illustrated. In the initial state, as indicated by a schematic magnetization diagram (a) in FIG. 4, the direction of magnetization of the recording layer 32 changes depending on data. However, from the second cycle, the recording layer 32 has the same direction of magnetization independently of data, as indicated by a schematic magnetization diagram (c) in FIG. 4.

(a-1) "0" Data Write

When "0" data is to be written in the MTJ element 10, the direction of magnetization of the recording layer 32 rotates in accordance with the following procedures.

In the initial state, both the bit line 11 and the word line 12 are OFF, as shown in FIG. 4. The write currents I1 and I2 are not flowing to these lines. The upper ferromagnetic layer 30 and recording layer 32 are coupled by anti-ferromagnetic coupling, and the lower ferromagnetic layer 34 and recording layer 32 are coupled by ferromagnetic coupling. For the descriptive convenience, the directions of magnetization of the upper ferromagnetic layer 30 and lower ferromagnetic layer 34 are inverted. In this initial state (non-energized state), the direction of magnetization of the upper ferromagnetic layer 30 is 180°, and the direction of magnetization of the lower ferromagnetic layer 34 is 0° (schematic magnetization diagram (a) in FIG. 4).

Figure 5:
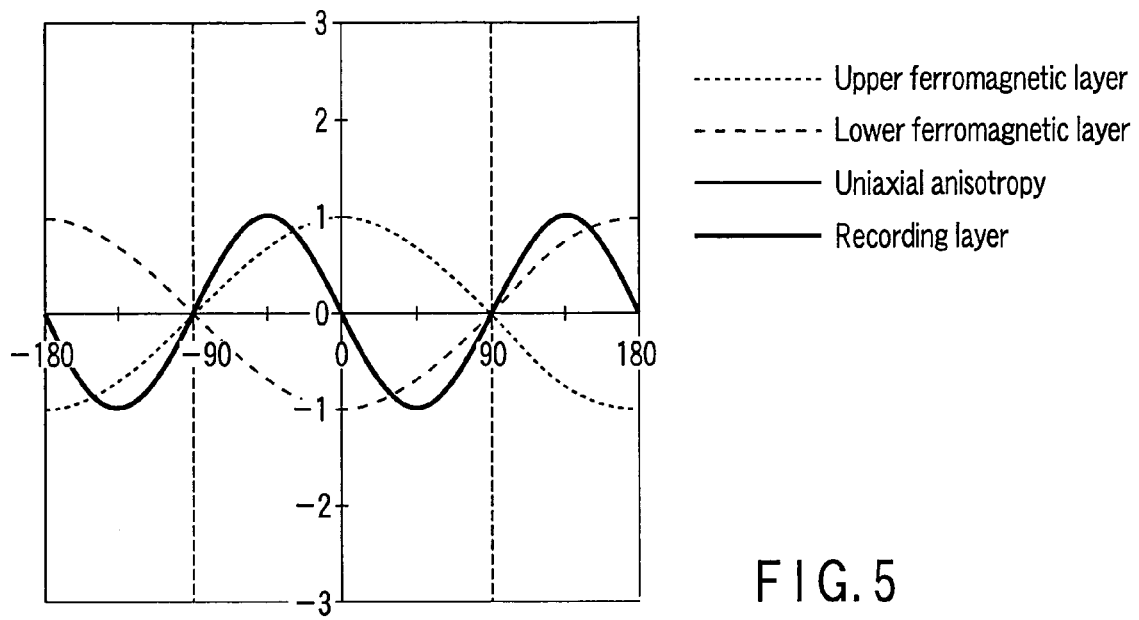
FIG. 5 is a graph showing the initial state of the "0" data write of the magnetic random access memory according to the first embodiment of the present invention.

In the initial state, as shown in FIG. 5, the magnetic energies generated by the upper ferromagnetic layer 30 and lower ferromagnetic layer 34 have the same amplitude, a phase shift of 180°, and extreme values at −180°, 0°, and 180°. The uniaxial anisotropic magnetic energy of the recording layer 32 has extreme values at −135°, −45°, 45°, and 135°. In the initial state, the magnetic energies generated by the upper ferromagnetic layer 30 and lower ferromagnetic layer 34 almost balance. Hence, the sum energy the recording layer 32 receives from the entire system takes minimal values at −135° and 45°, like the uniaxial anisotropic magnetic energy.

In the first cycle, as shown in FIG. 4, the bit line 11 is kept OFF, and the write current I1 is not supplied. The word line 12 is turned on to supply the write current I2. In this state, the direction of magnetization of the upper ferromagnetic layer 30 is kept in the 180° direction. However, the magnetization of the lower ferromagnetic layer 34 rotates to the 90° direction.

Figure 6:
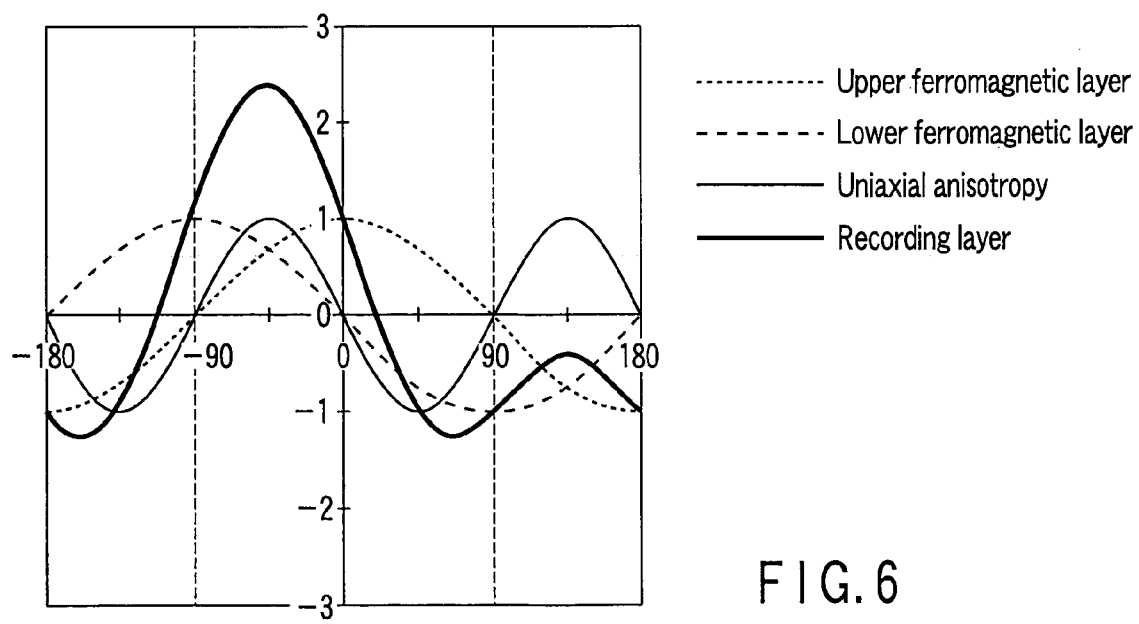
FIG. 6 is a graph showing the first cycle of the "0" data write of the magnetic random access memory according to the first embodiment of the present invention.

More specifically, the magnetic field generated by the write current I2 flowing to the word line 12 is guided to the lower ferromagnetic layer 34 by the second yoke layer 22. Accordingly, the phase of the magnetic energy of the lower ferromagnetic layer 34 is shifted by 90° (FIG. 6). The magnetization of the lower ferromagnetic layer 34 rotates by 90° (schematic magnetization diagram (b) in FIG. 4). As a result, the magnetization of the recording layer 32 which is coupled to the lower ferromagnetic layer 34 by ferromagnetic coupling rotates while being influenced by the rotation of magnetization in the lower ferromagnetic layer 34 (schematic magnetization diagram (b) in FIG. 4).

In the second cycle, as shown in FIG. 4, the bit line 11 is also tuned on to supply the write current I1 while keeping the write current I2 supplied to the word line 12. In this state, the direction of magnetization of the lower ferromagnetic layer 34 is kept in the 90° direction. The magnetization of the upper ferromagnetic layer 30 rotates to the 90° direction. For these reasons, the upper ferromagnetic layer 30 and lower ferromagnetic layer 34 have the same direction of magnetization.

Figure 7:
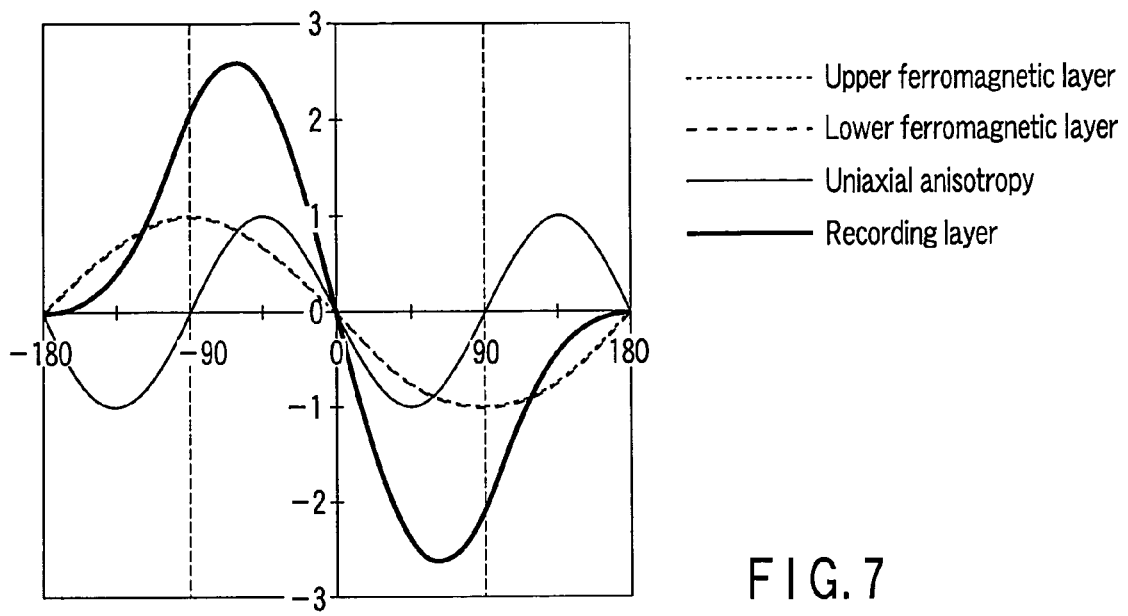
FIG. 7 is a graph showing the second cycle of the "0" data write of the magnetic random access memory according to the first embodiment of the present invention.

More specifically, the magnetic field generated by the write current I1 flowing to the bit line 11 is guided to the upper ferromagnetic layer 30 by the first yoke layer 21. Accordingly, the phase of the magnetic energy of the upper ferromagnetic layer 30 is shifted by 90° (FIG. 7). The magnetization of the upper ferromagnetic layer 30 rotates by 90° (schematic magnetization diagram (c) in FIG. 4). As a result, the magnetization of the recording layer 32 which is coupled to the upper ferromagnetic layer 30 by anti-ferromagnetic coupling rotates while being influenced by the rotation of magnetization in the upper ferromagnetic layer 30 (schematic magnetization diagram (c) in FIG. 4).

In the third cycle, as shown in FIG. 4, the word line 12 is turned off to stop supplying the write current I2 while keeping the write current I1 supplied to the bit line 11. In this state, the direction of magnetization of the upper ferromagnetic layer 30 is kept in the 90° direction. The direction of magnetization of the lower ferromagnetic layer 34 returns to the 0° direction in the initial stable state.

Figure 8:
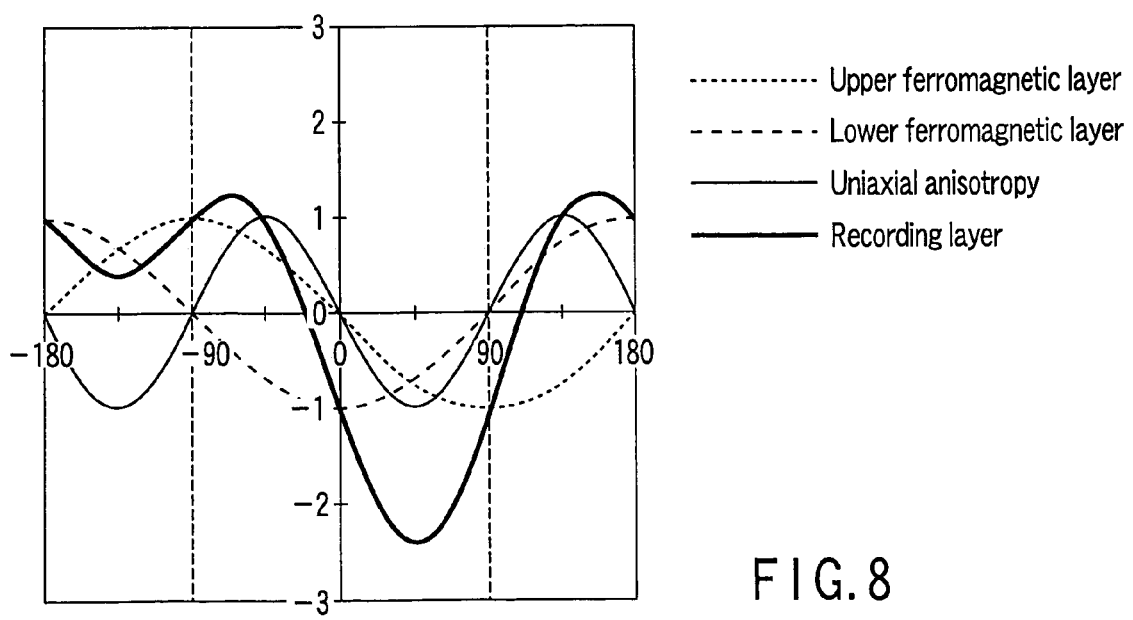
FIG. 8 is a graph showing the third cycle of the "0" data write of the magnetic random access memory according to the first embodiment of the present invention.

More specifically, the magnetic field generated by the write current I2 flowing to the word line 12 exists no longer. Since no magnetic field is applied to the magnetization of the lower ferromagnetic layer 34, it is going to return to the initial stable state. Hence, the phase of the magnetic energy of the lower ferromagnetic layer 34 is shifted by 90° (FIG. 8). The magnetization of the lower ferromagnetic layer 34 rotates by 90° (schematic magnetization diagram (d) in FIG. 4). As a result, the magnetization of the recording layer 32 which is coupled to the lower ferromagnetic layer 34 by ferromagnetic coupling rotates while being influenced by the rotation of magnetization in the lower ferromagnetic layer 34 (schematic magnetization diagram (d) in FIG. 4).

In the fourth cycle, as shown in FIG. 4, the bit line 11 is turned off, like the word line 12, to stop supplying the write current I1. In this state, the direction of magnetization of the lower ferromagnetic layer 34 is kept in the 0° direction. The direction of magnetization of the upper ferromagnetic layer 30 returns to the 180° direction in the initial stable state.

More specifically, the magnetic field generated by the write current I1 flowing to the bit line 11 exists no longer. Since no magnetic field is applied to the magnetization of the upper ferromagnetic layer 30, it is going to return to the initial stable state. Hence, the phase of the magnetic energy of the upper ferromagnetic layer 30 is shifted by 90° (FIG. 9). The magnetization of the upper ferromagnetic layer 30 rotates by 90° (schematic magnetization diagram (e) in FIG. 4). As a result, the magnetization of the recording layer 32 which is coupled to the upper ferromagnetic layer 30 by anti-ferromagnetic coupling rotates while being influenced by the rotation of magnetization in the upper ferromagnetic layer 30 (schematic magnetization diagram (e) in FIG. 4). Consequently, the direction of magnetization of the recording layer 32 changes to, e.g., a 45° direction, and "0" data is written. The magnetic energy state in the fourth cycle shown in FIG. 9 is the same as in the initial state shown in FIG. 5.

(a-2) "1" Data Write

When "1" data is to be written in the MTJ element 10, the direction of magnetization of the recording layer 32 rotates in accordance with the following procedures. To write "1" data, the supply directions of the write currents I1 and I2 are reversed to those in the above-described "0" data write.

In the initial state, both the bit line 11 and the word line 12 are OFF, as shown in FIG. 10. The write currents I1 and I2 are not flowing to these lines. The upper ferromagnetic layer 30 and recording layer 32 are coupled by anti-ferromagnetic coupling, and the lower ferromagnetic layer 34 and recording layer 32 are coupled by ferromagnetic coupling. For the descriptive convenience, the directions of magnetization of the upper ferromagnetic layer 30 and lower ferromagnetic layer 34 are inverted. In this initial state (non-energized state), the direction of magnetization of the upper ferromagnetic layer 30 is −180°, and the direction of magnetization of the lower ferromagnetic layer 34 is 0°.

Figure 11:
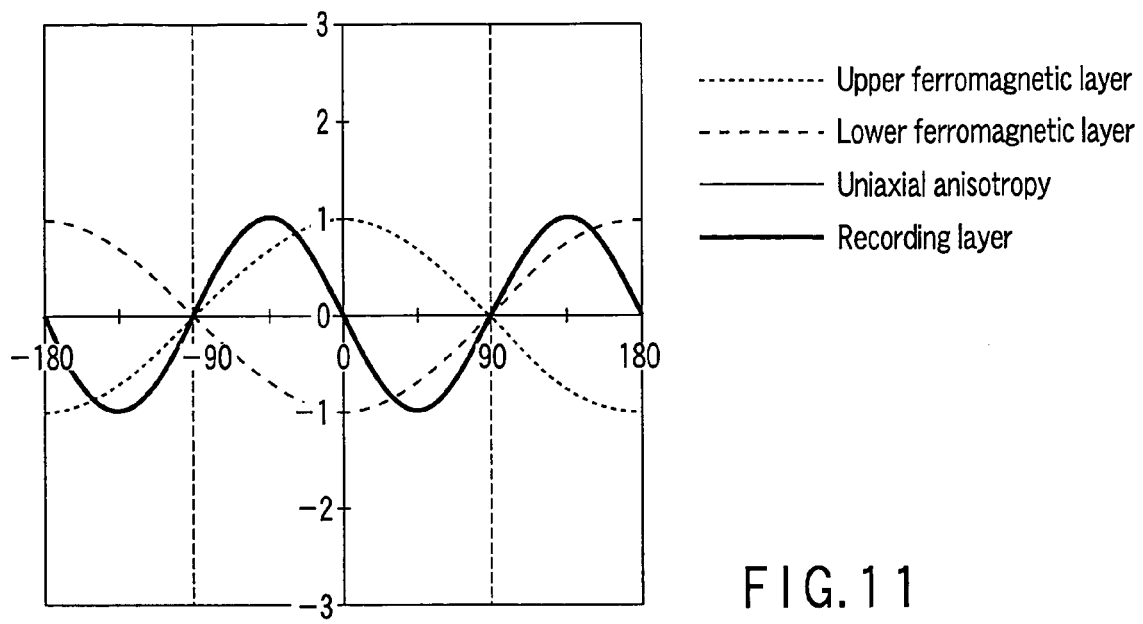
FIG. 11 is a graph showing the initial state of the "1" data write of the magnetic random access memory according to the first embodiment of the present invention.

In the initial state, as shown in FIG. 11, the magnetic energies of the upper ferromagnetic layer 30 and lower ferromagnetic layer 34 have the same amplitude, a phase shift of 180°, and extreme values at −180°, 0°, and 180°. The uniaxial anisotropic magnetic energy in the easy axis of magnetization of the recording layer 32 and the magnetic energy of the recording layer 32 form the same curve and have extreme values at −135°, −45°, 45°, and 135°.

In the first cycle, as shown in FIG. 10, the bit line 11 is kept OFF, and the write current I1 is not supplied. The word line 12 is turned on to supply the write current I2. In this state, the direction of magnetization of the upper ferromagnetic layer 30 is kept in the −180° direction. However, the magnetization of the lower ferromagnetic layer 34 rotates to a −90° direction.

Figure 12:
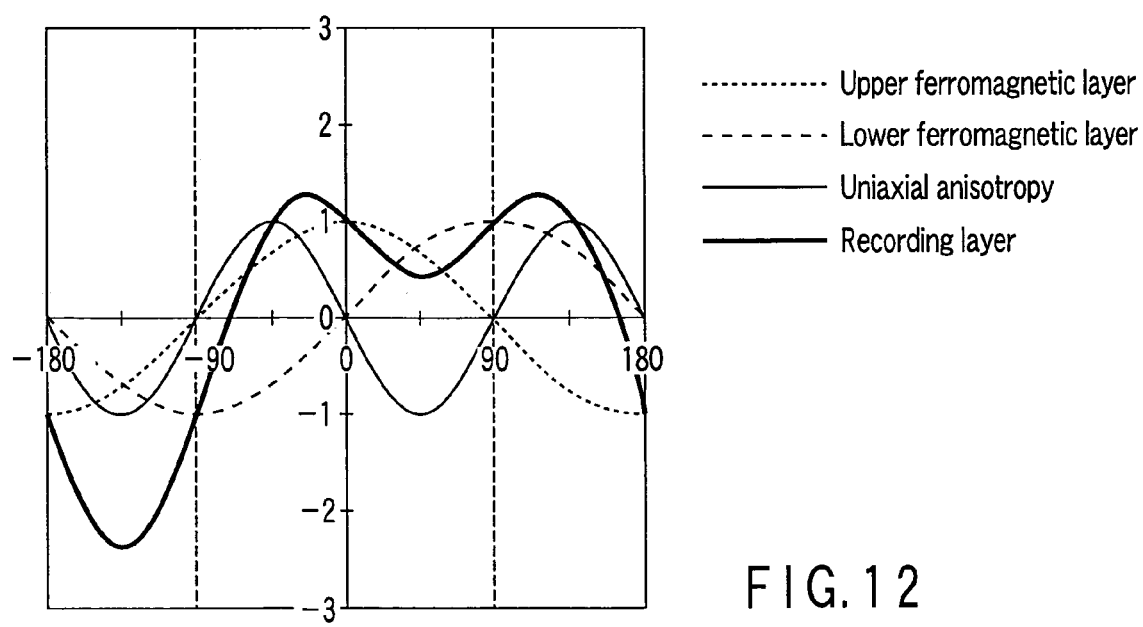
FIG. 12 is a graph showing the first cycle of the "1" data write of the magnetic random access memory according to the first embodiment of the present invention.

More specifically, the magnetic field generated by the write current I2 flowing to the word line 12 is guided to the lower ferromagnetic layer 34 by the second yoke layer 22. Accordingly, the phase of the magnetic energy of the lower ferromagnetic layer 34 is shifted by 90° (FIG. 12). The magnetization of the lower ferromagnetic layer 34 rotates by 90° (schematic magnetization diagram (b) in FIG. 10). As a result, the magnetization of the recording layer 32 which is coupled to the lower ferromagnetic layer 34 by ferromagnetic coupling rotates while being influenced by the rotation of magnetization in the lower ferromagnetic layer 34 (schematic magnetization diagram (b) in FIG. 10).

In the second cycle, as shown in FIG. 10, the bit line 11 is also tuned on to supply the write current I1 while keeping the write current I2 supplied to the word line 12. In this state, the direction of magnetization of the lower ferromagnetic layer 34 is kept in a −90° direction. The magnetization of the upper ferromagnetic layer 30 rotates to the −90° direction. For these reasons, the upper ferromagnetic layer 30 and lower ferromagnetic layer 34 have the same direction of magnetization.

More specifically, the magnetic field generated by the write current I1 flowing to the bit line 11 is guided to the upper ferromagnetic layer 30 by the first yoke layer 21. Accordingly, the phase of the magnetic energy of the upper ferromagnetic layer 30 is shifted by 90° (FIG. 13). The magnetization of the upper ferromagnetic layer 30 rotates by 90° (schematic magnetization diagram (c) in FIG. 10). As a result, the magnetization of the recording layer 32 which is coupled to the upper ferromagnetic layer 30 by anti-ferromagnetic coupling rotates while being influenced by the rotation of magnetization in the upper ferromagnetic layer 30 (schematic magnetization diagram (c) in FIG. 10).

In the third cycle, as shown in FIG. 10, the word line 12 is turned off to stop supplying the write current I2 while keeping the write current I1 supplied to the bit line 11. In this state, the direction of magnetization of the upper ferromagnetic layer 30 is kept in the −90° direction. The direction of magnetization of the lower ferromagnetic layer 34 returns to 0° in the initial stable state.

More specifically, the magnetic field generated by the write current I2 flowing to the word line 12 exists no longer. Since no magnetic field is applied to the magnetization of the lower ferromagnetic layer 34, it is going to return to the initial stable state. Hence, the phase of the magnetic energy of the lower ferromagnetic layer 34 is shifted by 90° (FIG. 14). The magnetization of the lower ferromagnetic layer 34 rotates by 90° (schematic magnetization diagram (d) in FIG. 10). As a result, the magnetization of the recording layer 32 which is coupled to the lower ferromagnetic layer 34 by ferromagnetic coupling rotates while being influenced by the rotation of magnetization in the lower ferromagnetic layer 34 (schematic magnetization diagram (d) in FIG. 10).

In the fourth cycle, as shown in FIG. 10, the bit line 11 is turned off, like the word line 12, to stop supplying the write current I1. In this state, the direction of magnetization of the lower ferromagnetic layer 34 is kept in the 0° direction. The direction of magnetization of the upper ferromagnetic layer 30 returns to the −180° direction in the initial stable state.

More specifically, the magnetic field generated by the write current I1 flowing to the bit line 11 exists no longer. Since no magnetic field is applied to the magnetization of the upper ferromagnetic layer 30, it is going to return to the initial stable state. Hence, the phase of the magnetic energy of the upper ferromagnetic layer 30 is shifted by 90° (FIG. 15). The magnetization of the upper ferromagnetic layer 30 rotates by 90° (schematic magnetization diagram (e) in FIG. 10). As a result, the magnetization of the recording layer 32 which is coupled to the upper ferromagnetic layer 30 by anti-ferromagnetic coupling rotates while being influenced by the rotation of magnetization in the upper ferromagnetic layer 30 (schematic magnetization diagram (e) in FIG. 10). Consequently, the direction of magnetization of the recording layer 32 changes to −135°, which is different from the direction in the "0" data write by 180°, and "1" data is written. The magnetic energy state in the fourth cycle shown in FIG. 15 is the same as in the initial state shown in FIG. 11.

(b) Relationship Between Magnetic Coupling State and Write Current Direction

FIG. 16 shows the relationship between the magnetic coupling state and the write current direction in the magnetic random access memory according to the first embodiment of the present invention.

As indicated by (a) in FIG. 16, the first magnetic coupling between the upper ferromagnetic layer 30 and the recording layer 32 is anti-ferromagnetic coupling, and the second magnetic coupling between the lower ferromagnetic layer 34 and the recording layer 32 is ferromagnetic coupling. In this case, both the write currents I1 and I2 of the bit line 11 and word line 12 are supplied toward the near side of the drawing surface to generate counterclockwise magnetic fields around the bit line 11 and word line 12.

As indicated by (b) in FIG. 16, the first magnetic coupling between the upper ferromagnetic layer 30 and the recording layer 32 is ferromagnetic coupling, and the second magnetic coupling between the lower ferromagnetic layer 34 and the recording layer 32 is anti-ferromagnetic coupling. In this case, both the write currents I1 and I2 of the bit line 11 and word line 12 are supplied toward the far side of the drawing surface to generate clockwise magnetic fields around the bit line 11 and word line 12.

As indicated by (c) in FIG. 16, both the first magnetic coupling between the upper ferromagnetic layer 30 and the recording layer 32 and the second magnetic coupling between the lower ferromagnetic layer 34 and the recording layer 32 are ferromagnetic coupling. In this case, the write current I1 of the bit line 11 is supplied toward the far side of the drawing surface to generate a clockwise magnetic field around the bit line 11. On the other hand, the write current I2 of the word line 12 is supplied toward the near side of the drawing surface to generate a counterclockwise magnetic field around the word line 12.

As indicated by (d) in FIG. 16, both the first magnetic coupling between the upper ferromagnetic layer 30 and the recording layer 32 and the second magnetic coupling between the lower ferromagnetic layer 34 and the recording layer 32 are anti-ferromagnetic coupling. In this case, the write current I1 of the bit line 11 is supplied toward the near side of the drawing surface to generate a counterclockwise magnetic field around the bit line 11. On the other hand, the write current I2 of the word line 12 is supplied toward the far side of the drawing surface to generate a clockwise magnetic field around the word line 12.

As described above, when the first and second magnetic coupling states are different, the write currents I1 and I2 are supplied in the same direction near the recording layer 32. On the other hand, when the first and second magnetic coupling states are the same, the write currents I1 and I2 are supplied in opposite directions near the recording layer 32.

The supply directions of the write currents I1 and I2 are reversed between the "0" data write and the "1" data write.

(c) Read Operation

Figures 17, 18:
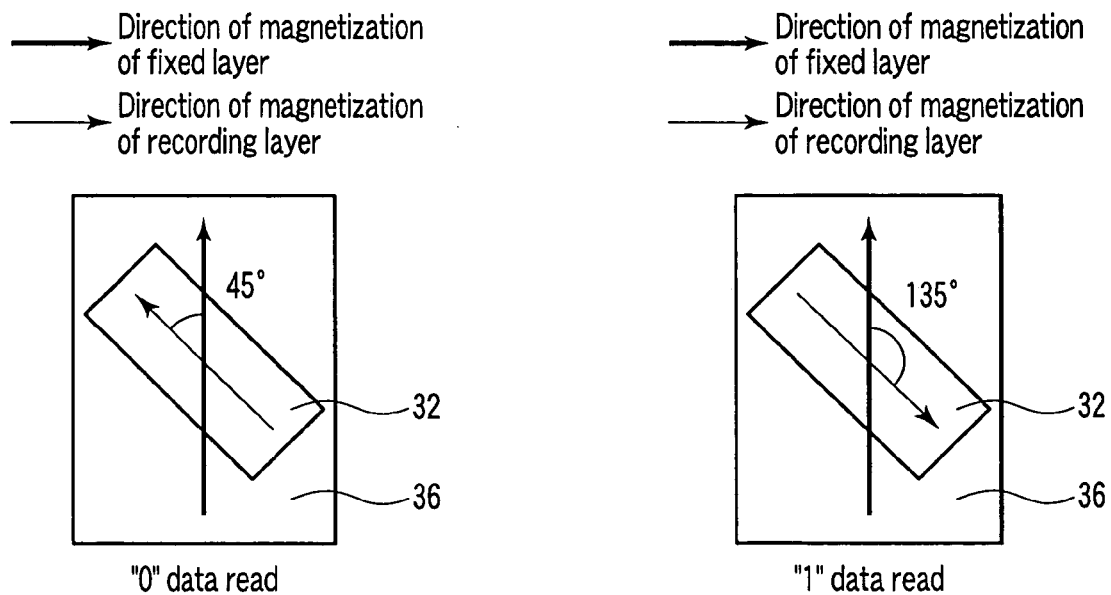
FIG. 17 is a schematic view showing the "0" data read of the magnetic random access memory according to the first embodiment of the present invention.
FIG. 18 is a schematic view showing the "1" data read of the magnetic random access memory according to the first embodiment of the present invention.

FIGS. 17 and 18 schematically show states in which "1" and "0" data are written in the magnetic random access memory according to the first embodiment of the present invention.

When "0" data is written in the MTJ element 10, for example, the direction of magnetization of the recording layer 32 tilts by 45° with respect to that of the fixed layer 36, as shown in FIG. 17. When "1" data is written in the MTJ element 10, for example, the direction of magnetization of the recording layer 32 tilts by 135° with respect to that of the fixed layer 36, as shown in FIG. 18.

To read the written data in this state, the MOSFET 15 is turned on to supply a read current from the bit line 11 to the MTJ element 10, like a normal MRAM, thereby reading the magnetic resistance of the MTJ element 10. More specifically, when "0" data is written, the direction of magnetization of the recording layer 32 is different from that of the fixed layer 36 by 45°, and a low resistance state is obtained. When "1" data is written, the direction of magnetization of the recording layer 32 is different from that of the fixed layer 36 by 135°, and a high resistance state is obtained. Hence, the data written in the MTJ element 10 is discriminated by reading the difference in magnetic resistance between the "1" data written state and the "0" data written state.

In the above case, the effective MR (MagnetoResistive) ratio of the MTJ element 10 decreases by about $1/\sqrt{2}$ as compared to a case wherein the magnetization of the recording layer 32 and that of the fixed layer 36 are parallel or anti-parallel. However, a sufficient read margin can be ensured.

When a read current is supplied to the MTJ element 10, a current may simultaneously be supplied to the word line 12 to rotate the magnetization of the lower ferromagnetic layer 34. Accordingly, the resistance of the MTJ element 10 increases or decreases. When this change is sensed, a self-reference read can be executed.

According to the first embodiment, the nonmagnetic layers 31 and 33 are formed on the upper and lower surfaces of the recording layer 32. The upper ferromagnetic layer 30 and lower ferromagnetic layer 34 are formed on the nonmagnetic layers 31 and 33, respectively. The recording layer 32 and the upper ferromagnetic layer 30 and lower ferromagnetic layer 34 are magnetically coupled. With this structure, in the data write, the rotation of magnetization of the upper ferromagnetic layer 30 and lower ferromagnetic layer 34 affected by the magnetic fields generated by the write currents I1 and I2 is transmitted to the recording layer 32 by magnetic coupling, thereby rotating the magnetization of the recording layer 32.

In such a data write, a closed magnetic circuit is formed by the yoke layer 21 formed around the bit line 11 and the upper ferromagnetic layer 30. A narrow magnetic circuit is formed by the yoke layer 22 formed around the word line 12 and the lower ferromagnetic layer 34. With these magnetic circuits, magnetic fields generated by the write currents I1 and I2 can be guided to the upper ferromagnetic layer 30 and lower ferromagnetic layer 34. Since the magnetization of the upper ferromagnetic layer 30 and lower ferromagnetic layer 34 can be rotated by the relatively small write currents I1 and I2, the write currents I1 and I2 can be decreased.

Since magnetic fields generated by the write currents I1 and I2 can be efficiently guided to the upper ferromagnetic layer 30 and lower ferromagnetic layer 34 by the magnetic circuits, disturbance (write errors in semi-selected cells) can be suppressed.

When data is written in the recording layer 32 by magnetic coupling between the recording layer 32 and the upper ferromagnetic layer 30 and lower ferromagnetic layer 34, an inversion variation in the recording layer 32 due to the roughness at the element end portion can be reduced as compared to a case wherein data is directly written in the recording layer 32 by a current magnetic field.

In the initial state of the write operation, the directions of magnetization of the upper ferromagnetic layer 30 and lower ferromagnetic layer 34 are set to parallel or anti-parallel. The easy axis of magnetization of the recording layer 32 is tilted by 45° with respect to the direction of magnetization. Accordingly, a two-axis write can be implemented so that data can selectively be written in only the cell at the interconnection between the bit line 11 and the word line 12.

Since a read before a write is unnecessary, unlike a toggle type MRAM, the write operation speed can be increased.

[Second Embodiment]

The second embodiment is a modification to the first embodiment. A cap layer is inserted between an upper ferromagnetic layer and a bit line.

Figure 19:
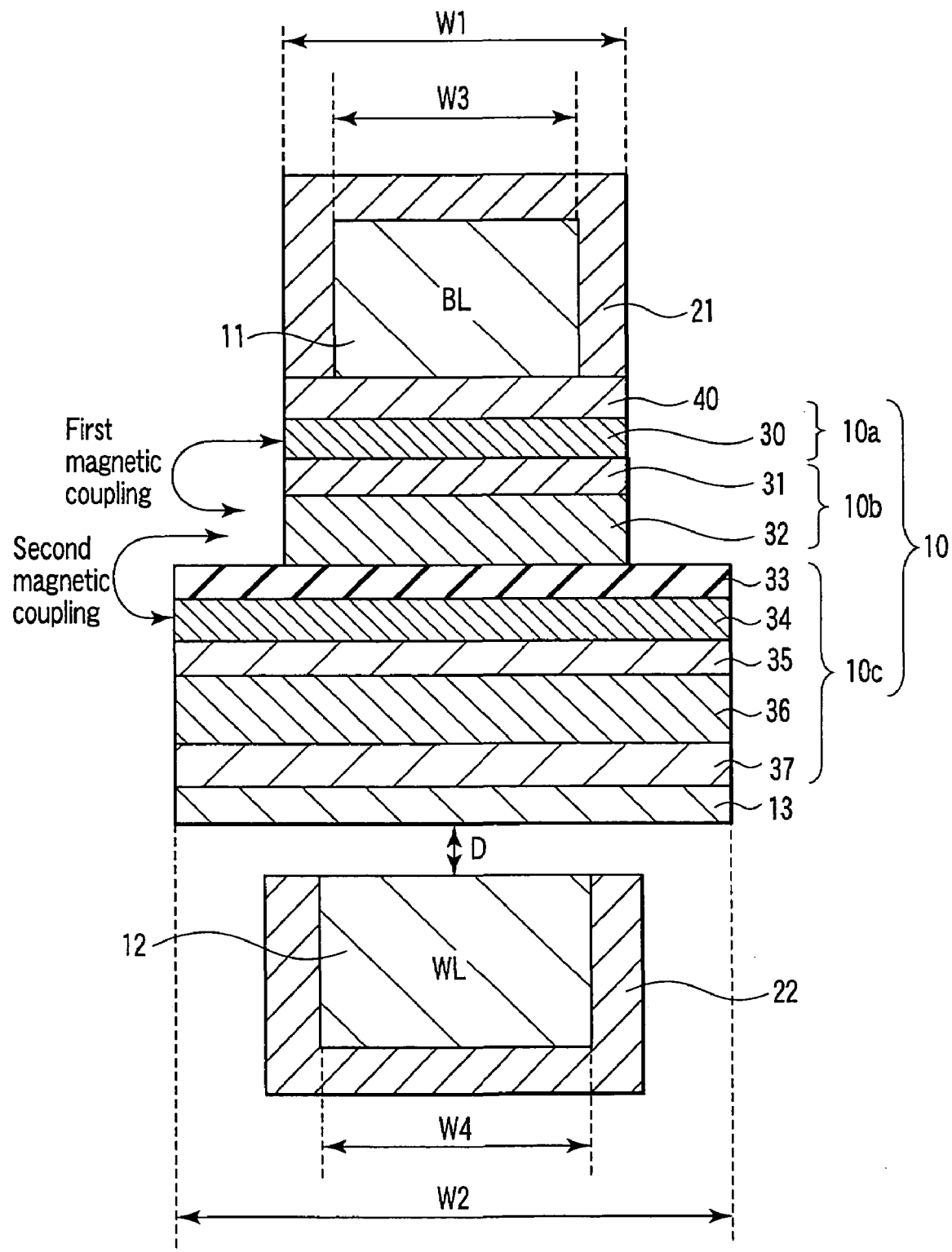
FIG. 19 is a sectional view showing a magnetic random access memory according to the second embodiment of the present invention.

FIG. 19 is a sectional view of a magnetic random access memory according to the second embodiment of the present invention. The structure of the magnetic random access memory according to the second embodiment will be described below. The difference to the first embodiment will mainly be described.

As shown in FIG. 19, the second embodiment is different from the first embodiment in that a cap layer 40 is formed between an upper ferromagnetic layer 30 and a bit line 11. The cap layer 40 is used as a mask in patterning first and second portions 10a and 10b of an MTJ element 10. The cap layer 40 is formed from a conductive material to electrically connect the MTJ element 10 to the bit line 11.

In the first embodiment, the upper ferromagnetic layer 30 has the same planar shape as that of the bit line 11. In the second embodiment, the upper ferromagnetic layer 30 has the same planar shape as that of the second portion 10b of the MTJ element 10. To align the direction of magnetization of the upper ferromagnetic layer 30 to the running direction of the bit line 11 in a non-energized state, the upper ferromagnetic layer 30 must have induced magnetic anisotropy. More specifically, for example, the upper ferromagnetic layer 30 is formed while applying a magnetic field in the running direction of the bit line 11.

According to the second embodiment, the same effect as in the first embodiment can be obtained. In addition, when the cap layer 40 is formed, the structure up to a recording layer 32 can integrally be formed. Accordingly, the upper ferromagnetic layer 30 and a nonmagnetic layer 31 can continuously be formed, and the interface between them can easily be controlled normally. This is effective for implementing stable magnetic coupling and increasing the yield and reliability of the magnetic random access memory.

[Third Embodiment]

The third embodiment is a modification to the first embodiment. Bit lines and word lines have wiggle shapes.

Figure 20:
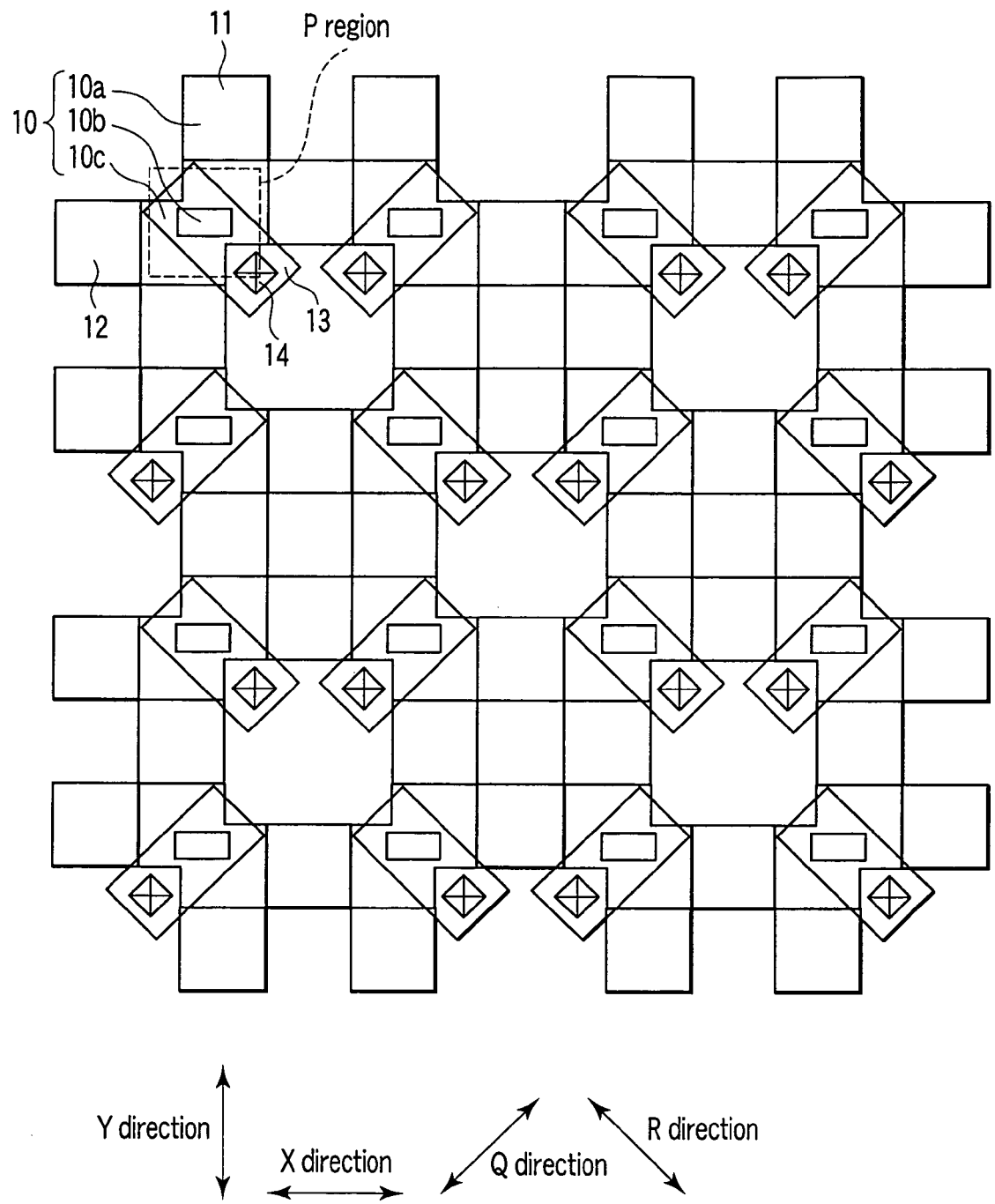
FIG. 20 is a plan view showing a magnetic random access memory according to the third embodiment of the present invention.
Figure 21:
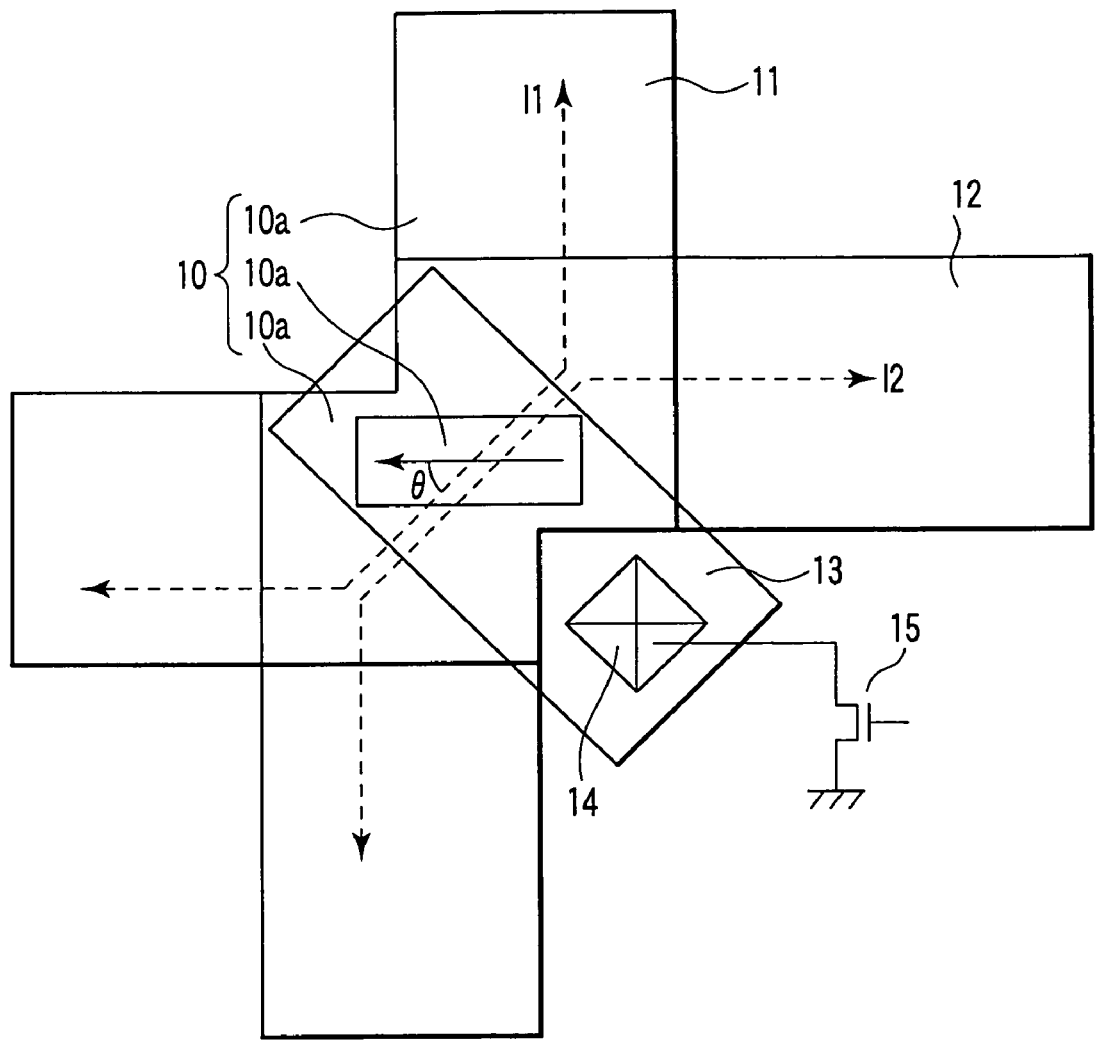
FIG. 21 is a plan view showing one cell of the magnetic random access memory according to the third embodiment of the present invention.

FIGS. 20 and 21 show a magnetic random access memory according to the third embodiment of the present invention. The structure of the magnetic random access memory according to the third embodiment will be described below. The difference to the first embodiment will mainly be described.

As shown in FIGS. 20 and 21, the third embodiment is different from the first embodiment in that a bit line 11 and word line 12 have wiggle shapes. Hence, the bit line 11 runs in one direction (Y direction) as a whole while wiggling (zigzagging) in multiple directions (Q direction and R direction) in certain regions (P regions). The word line 12 also runs in one direction (X direction) as a whole while wiggling (zigzagging) in multiple directions (Q direction and R direction) in certain regions (P regions). The bit lines 11 running in the Y direction as a whole cross the word line 12 running in the X direction as a whole, thereby forming a matrix-shaped cell array.

In other words, in the P region, the bit line 11 and word line 12 (the directions in which write currents I1 and I2 flow) run parallel to each other while overlapping. In a region except the P region, the bit line 11 and word line 12 run in different directions (e.g., directions perpendicular to each other).

In the third embodiment, a second portion 10b of an MTJ element 10 is formed in the P region where the bit line 11 and word line 12 run parallel while overlapping. The second portion 10b tilts by θ with respect to the direction in which the write currents I1 and I2 flow in the P region. In other words, the easy axis of magnetization of a recording layer 32 tilts by θ with respect to the Q or R direction. The tilt θ is about 30° to 60°, and most preferably, 45° (−45°), as in the first embodiment.

The write and read operations are also the same as in the first embodiment. In the initial state of the write operation, the directions of magnetization of an upper ferromagnetic layer 30 and lower ferromagnetic layer 34 in the P region are set to parallel or anti-parallel.

According to the third embodiment, the same effect as in the first embodiment can be obtained. In addition, when the bit line 11 and word line 12 have wiggle shapes, a matrix-shaped memory cell array can be formed. Hence, the cell area can be reduced.

The present invention is not limited to the above embodiments, and various changes and modifications can be made in the following way within the spirit and scope of the present invention.

(1) In the above embodiments, a memory cell has a 1 MTJ+1 Tr (transistor) structure. However, the present invention is not limited to this. For example, in place of a transistor, a diode may be used as a read switching element. A cross point structure using no read switching element for each cell may be employed.

(2) In the above embodiments, the recording layer 32 and fixed layer 36 have a single-layer structure. Instead, a multilayered structure may be formed.

(3) In the above embodiments, the fixed layer 36 has a single-layer structure. Instead, a multilayered pin structure with weak coupling may be formed.

(4) In the above embodiments, the write operation is executed in four cycles. However, the number of cycles can be decreased by making them overlap. For example, the first cycle and second cycle may simultaneously be executed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
    a first write wiring line which runs in a first direction;
    a second write wiring line which has a first region where the second write wiring line runs in the first direction while overlapping the first write wiring line and a second region where the second write wiring line runs in a second direction different from the first direction;
    a magnetoresistive element formed between the first write wiring line and the first region of the second write wiring line;
    a first yoke layer which is formed from a magnetic layer and formed on a surface of the first write wiring line on an opposite side of a surface facing the magnetoresistive element and both side surfaces of the first write wiring line; and a second yoke layer which is formed from a magnetic layer and formed on a surface of the second write wiring line on an opposite side of a surface facing the magnetoresistive element and both side surfaces of the second write wiring line, the magnetoresistive element having a recording layer which is formed from a ferromagnetic material, comprises a first surface and a second surface, and has an easy axis of magnetization whose direction in a non-energized state tilts by 30° to 60° with respect to the first direction, a first ferromagnetic layer which is formed on a side of the first surface of the recording layer, formed from a ferromagnetic material whose direction of magnetization in the non-energized state is aligned to the first direction, and magnetically coupled to the recording layer by first magnetic coupling, a second ferromagnetic layer which is formed on a side of the second surface of the recording layer, formed from a ferromagnetic material whose direction of magnetization in the non-energized state is aligned to the first direction, and magnetically coupled to the recording layer by second magnetic coupling, a first nonmagnetic layer formed between the recording layer and the first ferromagnetic layer, and a second nonmagnetic layer formed between the recording layer and the second ferromagnetic layer.

2. The memory according to claim 1, wherein a direction of the easy axis of magnetization in the non-energized state tilts by 45° with respect to the first direction.

3. The memory according to claim 1, wherein one of the first magnetic coupling and the second magnetic coupling is anti-ferromagnetic coupling, and the other of the first magnetic coupling and the second magnetic coupling is ferromagnetic coupling.

4. The memory according to claim 1, wherein both the first magnetic coupling and the second magnetic coupling are one of ferromagnetic coupling and anti-ferromagnetic coupling.

5. The memory according to claim 1, wherein a uniaxial anisotropic energy of the easy axis of magnetization and energies of the first magnetic coupling and the second magnetic coupling have almost the same magnitudes.

6. The memory according to claim 1, wherein letting W1 be a width of the first ferromagnetic layer, W2 be a width of the second ferromagnetic layer, W3 be a width of the first write wiring line, and W4 be a width of the second write wiring line, a relation given by $W1, W2 \geq W3, W4$ is satisfied.

7. The memory according to claim 1, further comprising a conductive layer formed between the first write wiring line and the first ferromagnetic layer.

8. The memory according to claim 1, wherein each of the first write wiring line and the second write wiring line has a wiggle shape.

9. A data write method for a magnetic random access memory comprising a first write wiring line which runs in a first direction, a second write wiring line which has a first region where the second write wiring line runs in the first direction while overlapping the first write wiring line and a second region where the second write wiring line runs in a second direction different from the first direction, a magnetoresistive element formed between the first write wiring line and the first region of the second write wiring line, a first yoke layer which is formed from a magnetic layer and formed on a surface of the first write wiring line on an opposite side of a surface facing the magnetoresistive element and both side surfaces of the first write wiring line, and a second yoke layer which is formed from a magnetic layer and formed on a surface of the second write wiring line on an opposite side of a surface facing the magnetoresistive element and both side surfaces of the second write wiring line, the magnetoresistive element having a recording layer which is formed from a ferromagnetic material, comprises a first surface and a second surface, and has an easy axis of magnetization whose direction in a non-energized state tilts by 30° to 60° with respect to the first direction, a first ferromagnetic layer which is formed on a side of the first surface of the recording layer, formed from a ferromagnetic material whose direction of magnetization in the non-energized state is aligned to the first direction, and magnetically coupled to the recording layer by first magnetic coupling, a second ferromagnetic layer which is formed on a side of the second surface of the recording layer, formed from a ferromagnetic material whose direction of magnetization in the non-energized state is aligned to the first direction, and magnetically coupled to the recording layer by second magnetic coupling, a first nonmagnetic layer formed between the recording layer and the first ferromagnetic layer, and a second nonmagnetic layer formed between the recording layer and the second ferromagnetic layer, comprising:

in writing data in the magnetoresistive element, supplying a first write current and a second write current to the first write wiring line and the second write wiring line, respectively, to generate a first magnetic field and a second magnetic field by the first write current and the second write current, respectively;

applying the first magnetic field and the second magnetic field to the first ferromagnetic layer and the second ferromagnetic layer, respectively, to rotate the magnetization of the first ferromagnetic layer and the second ferromagnetic layer, respectively;

causing the magnetization of the first ferromagnetic layer and the second ferromagnetic layer to rotate magnetization of the recording layer by the first magnetic coupling and the second magnetic coupling.

10. The method according to claim 9, wherein a direction of the easy axis of magnetization in the non-energized state tilts by 45° with respect to the first direction.

11. The method according to claim 9, wherein a uniaxial anisotropic energy of the easy axis of magnetization and energies of the first magnetic coupling and the second magnetic coupling have almost the same magnitudes.

12. The method according to claim 9, wherein letting W1 be a width of the first ferromagnetic layer, W2 be a width of the second ferromagnetic layer, W3 be a width of the first write wiring line, and W4 be a width of the second write wiring line, a relation given by

W1, W2≧W3, W4 is satisfied.

13. The method according to claim 9, wherein the first write wiring line and the second write wiring line are sequentially turned on, and one of the first write wiring line and the second write wiring line, which is turned on first, is turned off first.

14. The method according to claim 9, wherein
the first yoke layer guides the first magnetic field to the first ferromagnetic layer, and
the second yoke layer guides the second magnetic field to the second ferromagnetic layer.

15. The method according to claim 9, wherein
one of the first magnetic coupling and the second magnetic coupling is anti-ferromagnetic coupling, and
the other of the first magnetic coupling and the second magnetic coupling is ferromagnetic coupling.

16. The method according to claim 15, wherein the first write current and the second write current are supplied in the same direction near the recording layer.

17. The method according to claim 9, wherein both the first magnetic coupling and the second magnetic coupling are one of ferromagnetic coupling and anti-ferromagnetic coupling.

18. The method according to claim 17, wherein the first write current and the second write current are supplied in opposite directions near the recording layer.

19. The method according to claim 9, wherein the first write current and the second write current flow in both direction in the first write wiring line and the second write wiring line.

20. The method according to claim 9, wherein supply directions of the first write current and the second write current are reversed between a "0" data write and a "1" data write.

* * * * *